United States Patent
Hayashi et al.

(10) Patent No.: US 11,791,080 B2
(45) Date of Patent: Oct. 17, 2023

(54) SUPERCONDUCTING COIL, SUPERCONDUCTING DEVICE, AND SUPERCONDUCTING WIRE ROD FOR SUPERCONDUCTING COIL

(71) Applicant: KABUSHIKI KAISHA TOSHIBA, Tokyo (JP)

(72) Inventors: Mariko Hayashi, Shinagawa Tokyo (JP); Takashi Kuboki, Ota Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 17/007,369

(22) Filed: Aug. 31, 2020

(65) Prior Publication Data
US 2021/0296034 A1  Sep. 23, 2021

(30) Foreign Application Priority Data

Mar. 17, 2020 (JP) ................. 2020-046766

(51) Int. Cl.
| H01F 6/00 | (2006.01) |
| H01F 6/06 | (2006.01) |
| H01F 41/04 | (2006.01) |
| H10N 60/85 | (2023.01) |

(52) U.S. Cl.
CPC ............. *H01F 6/06* (2013.01); *H01F 41/048* (2013.01); *H10N 60/85* (2023.02)

(58) Field of Classification Search
CPC ......... H01F 6/06; H01F 41/048; H01L 39/12; H01L 39/02
USPC ......................................... 335/216
See application file for complete search history.

(56) References Cited

U.S. PATENT DOCUMENTS

| 2005/0079132 | A1* | 4/2005 | Wang ................ A61N 2/06 424/1.11 |
| 2006/0186419 | A1* | 8/2006 | Mikoshiba ........... H05B 33/145 257/79 |
| 2007/0262694 | A1* | 11/2007 | Mikoshiba ............. C09K 11/06 313/483 |
| 2010/0265019 | A1 | 10/2010 | Groeppel et al. |
| 2011/0117202 | A1* | 5/2011 | Bourke, Jr. ............ H01J 65/042 977/773 |
| 2013/0337314 | A1* | 12/2013 | Essaki ................... H01M 4/134 429/163 |

(Continued)

FOREIGN PATENT DOCUMENTS

| JP | H5-159958 A | 6/1993 |
| JP | H7-161521 A | 6/1995 |

(Continued)

*Primary Examiner* — Shawki S Ismail
*Assistant Examiner* — Lisa N Homza
(74) *Attorney, Agent, or Firm* — Finnegan, Henderson, Farabow, Garrett & Dunner, LLP

(57) ABSTRACT

A superconducting coil of embodiments includes a substrate having a curved surface, a superconducting wire wound on the curved surface, the superconducting wire having a first region and a second region facing the first region, a first resin layer surrounding the superconducting wire and including a plurality of first particles and first resin surrounding the first particles, and a second resin layer positioned between the first region and the second region, the second resin layer covering the first resin layer and including a plurality of second particles and second resin surrounding the second particles and being made of material different from material of the first resin.

14 Claims, 26 Drawing Sheets

(56) References Cited

U.S. PATENT DOCUMENTS

| | | | |
|---|---|---|---|
| 2014/0199579 A1* | 7/2014 | Morita | H01M 4/583 252/507 |
| 2014/0199584 A1* | 7/2014 | Kondo | H01M 4/136 429/211 |
| 2014/0199593 A1* | 7/2014 | Hotta | H01M 4/133 429/217 |
| 2014/0295291 A1* | 10/2014 | Kondo | H01M 4/8668 429/403 |
| 2015/0086870 A1* | 3/2015 | Fukasawa | H01M 4/131 429/218.1 |
| 2016/0285081 A1* | 9/2016 | Matsuno | H01M 4/386 |
| 2016/0372744 A1* | 12/2016 | Essaki | H01M 10/0525 |
| 2017/0092942 A1* | 3/2017 | Fukasawa | H01M 10/0525 |
| 2018/0268975 A1* | 9/2018 | Bauer | H01F 6/06 |
| 2020/0294698 A1 | 9/2020 | Hayashi et al. | |

FOREIGN PATENT DOCUMENTS

| | | | | |
|---|---|---|---|---|
| JP | H08316023 | * | 11/1996 | ............ H01F 27/32 |
| JP | H9-69454 A | | 3/1997 | |
| JP | H9-213520 A | | 8/1997 | |
| JP | H11-43610 A | | 2/1999 | |
| JP | H11-260625 A | | 9/1999 | |
| JP | 2000-44803 A | | 2/2000 | |
| JP | 2006-135060 A | | 5/2006 | |
| JP | 2006-319189 A | | 11/2006 | |
| JP | 2010-93036 A | | 4/2010 | |
| JP | 2011-198469 A | | 10/2011 | |
| JP | 2014-111693 A | | 6/2014 | |
| JP | 2018-117042 A | | 7/2018 | |
| JP | 2019-169468 A | | 10/2019 | |
| JP | 2020-31128 A | | 2/2020 | |
| JP | 2020-150240 | | 9/2020 | |

* cited by examiner

RADIAL DIRECTION OF COIL (FIRST DIRECTION)

SUPERCONDUCTING COIL, SUPERCONDUCTING DEVICE, AND SUPERCONDUCTING WIRE ROD FOR SUPERCONDUCTING COIL

CROSS-REFERENCE TO RELATED APPLICATION

This application is based upon and claims the benefit of priority from Japanese Patent Application No. 2020-046766, filed on Mar. 17, 2020, the entire contents of which are incorporated herein by reference.

FIELD

Embodiments described herein relate generally to a superconducting coil, a superconducting device, and a superconducting wire rod for superconducting coil.

BACKGROUND

For example, a superconducting coil is used in a nuclear magnetic resonance apparatus (NMR) or in a magnetic resonance imaging apparatus (MRI) to generate a powerful magnetic field. A superconducting coil is formed by a superconducting wire wound on a winding frame.

When quenching occurs in which a superconducting state of a portion of the superconducting wire is broken and transitions to a normal conducting state, for example, current flowing through the superconducting coil fluctuates and a magnetic field generated by the superconducting coil becomes unstable. Further, for example, Joule heat generated at the portion where the quenching has occurred may cause thermal runaway in which a large amount of heat is generated instantaneously. If thermal runaway occurs, the superconducting coil may be burned out.

One of causes of quenching is heat generation due to release of strain energy of impregnated resin surrounding a superconducting wire. Due to the heat generation, temperature of the superconducting wire rises to equal to or more than superconducting transition temperature, and quenching occurs.

When the superconducting coil is cooled, strain energy is accumulated in the impregnated resin due to difference in thermal shrinkage between metal included in the superconducting wire and the impregnated resin. When the superconducting coil is energized, strain energy is accumulated in the impregnated resin so as to inhibit action of the superconducting wire caused by electromagnetic force. The accumulated strain energy is released by, for example, cracking occurred in the impregnated resin, and heat is generated.

In order to reduce difference in thermal shrinkage between the metal included in the superconducting wire and the impregnated resin, inorganic filler is added to the impregnated resin. By adding the inorganic filler, difference in coefficient of thermal expansion between the metal included in the superconducting wire and the impregnated resin is reduced, and the difference in thermal shrinkage is reduced. Reduction of the difference in thermal shrinkage between the metal included in the superconducting wire and the impregnated resin reduces strain energy accumulated during cooling of the superconducting coil. Therefore, cracking is less likely to occur, and occurrence of quenching is suppressed.

Further, inclusion of filler in the impregnated resin increases fracture toughness of the impregnated resin. Even if strain energy accumulates and an initial cracking occurs, the increased fracture toughness of the impregnated resin hinders crack propagation, and occurrence of quenching is suppressed.

DETAILED DESCRIPTION

A superconducting coil of the present embodiments includes a substrate having a curved surface; a superconducting wire wound on the curved surface, the superconducting wire having a first region and a second region facing the first region; a first resin layer surrounding the superconducting wire and including a plurality of first particles and first resin surrounding the first particles; and a second resin layer positioned between the first region and the second region, the second resin layer covering the first resin layer and including a plurality of second particles and second resin surrounding the second particles and the second resin being made of material different from material of the first resin.

Hereinafter, embodiments of the present disclosure will be described with reference to the drawings. In the following description, the same or similar members will be denoted by the same reference signs, and description of a member described once will be appropriately omitted.

In the present specification, "superconducting wire" is used as a term indicating a part excluding a coating layer such as resin, and "superconducting wire rod" is used as a term indicating a part including the superconducting wire and the coating layer such as resin.

First Embodiment

A superconducting coil of a first embodiment includes a substrate having a curved surface, a superconducting wire wound on the curved surface, the superconducting wire having a first region and a second region facing the first region, a first resin layer surrounding the superconducting wire and including a plurality of first particles and first resin surrounding the first particles, and a second resin layer positioned between the first region and the second region, the second resin layer covering the first resin layer and including a plurality of second particles and second resin surrounding the second particles and being made of material different from material of the first resin.

Figure 1A:
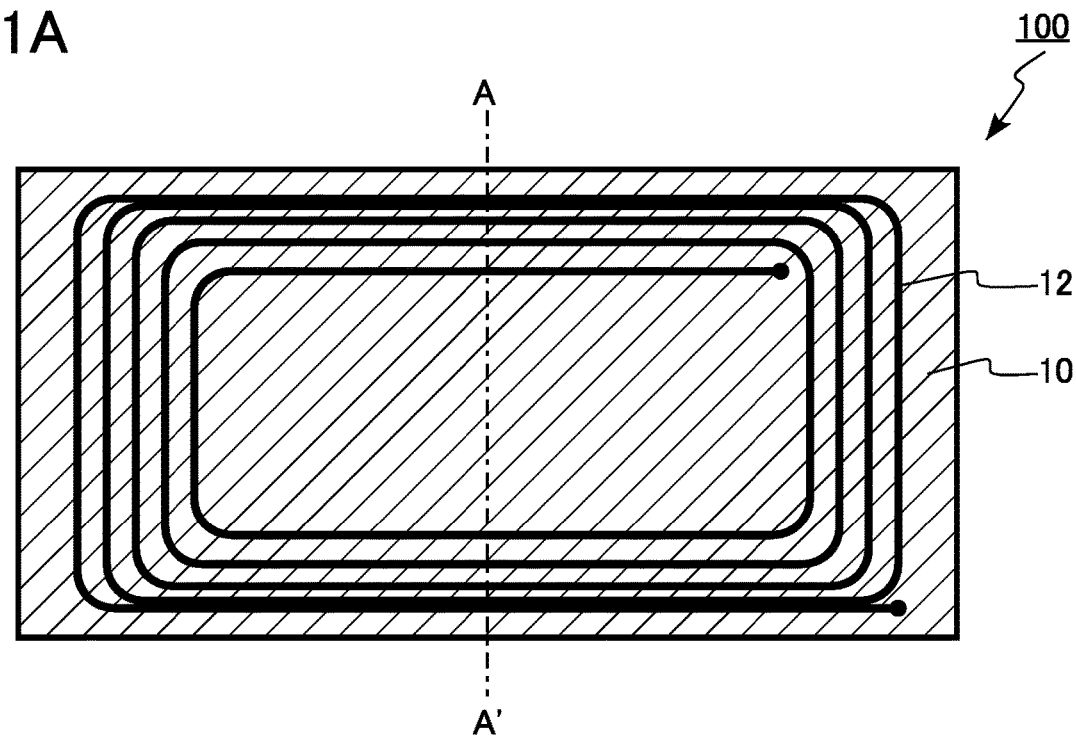
FIGS. 1A and 1B are schematic diagrams illustrating a superconducting coil of a first embodiment.
Figure 1B:
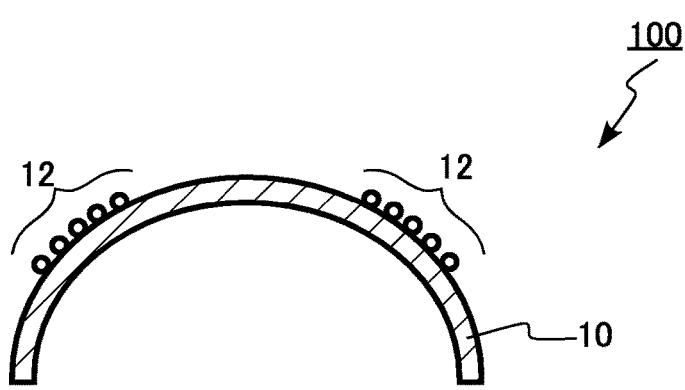
Figure 2:
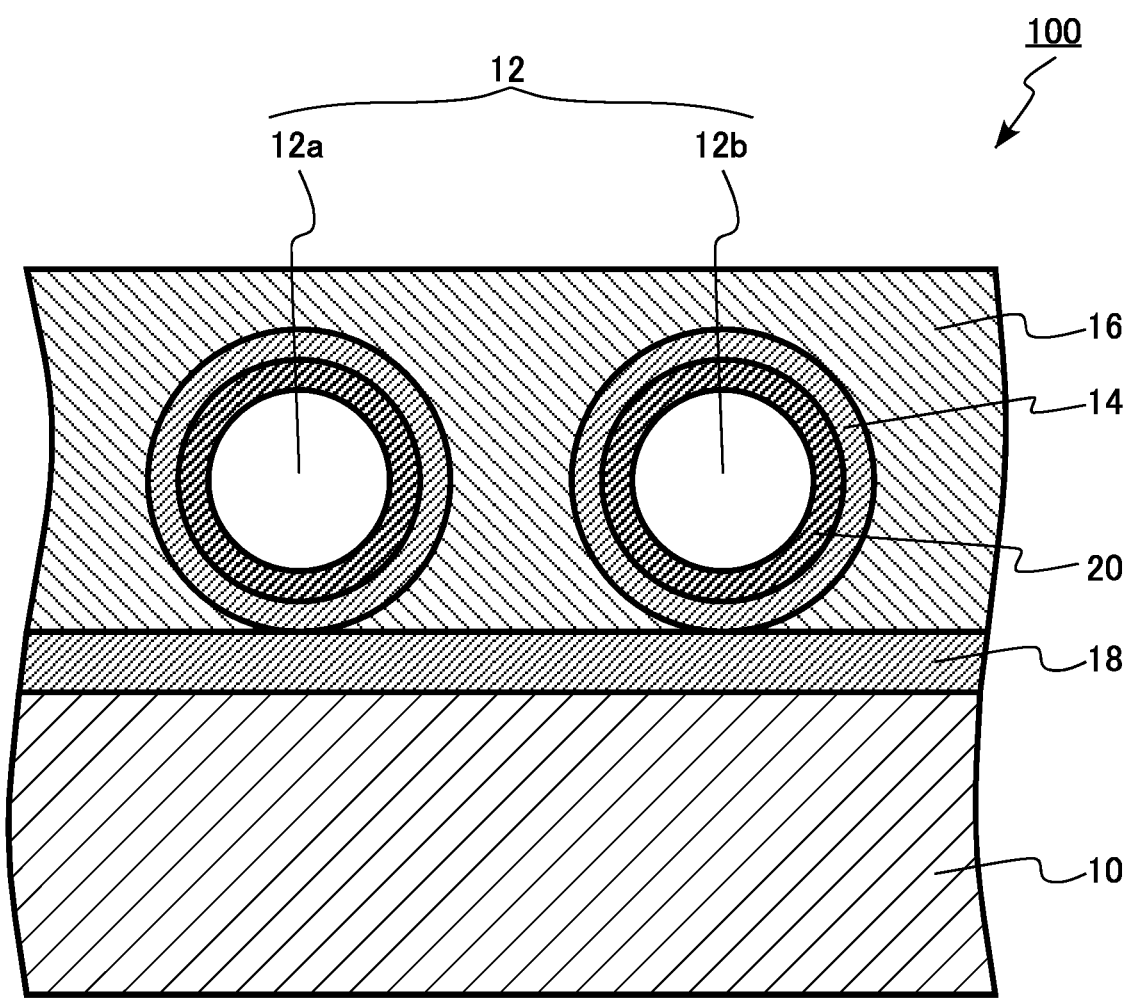
FIG. 2 is an enlarged schematic cross-sectional view illustrating the superconducting coil of the first embodiment.

FIGS. 1A and 1B are schematic diagrams illustrating a superconducting coil of the first embodiment. FIG. 1A is a top view and FIG. 1B is a cross-sectional view. FIG. 1B illustrates a cross section taken along the line A-A' of FIG. 1A. FIG. 2 is an enlarged schematic cross-sectional view illustrating the superconducting coil of the first embodiment.

A superconducting coil 100 of the first embodiment is used as, for example, a coil for magnetic field generation of a superconducting device, such as an NMR, an MRI, heavy particle therapy equipment, a superconducting magnetic levitation railway vehicle, or a single-crystal pulling magnet. The superconducting coil 100 of the first embodiment is a so-called saddle type coil.

The superconducting coil 100 includes an insulating substrate 10, a superconducting wire 12, a first fixing resin layer 14, an inter-wire resin layer 16, a second fixing resin layer 18, and a coating resin layer 20.

The insulating substrate 10 is an example of a substrate. The first fixing resin layer 14 is an example of the first resin layer. The inter-wire resin layer 16 is an example of the second resin layer. The second fixing resin layer 18 is an example of a third resin layer. The coating resin layer 20 is an example of a fourth resin layer.

The insulating substrate 10 has a curved surface. The insulating substrate 10 is an insulator. The insulating substrate 10 is formed of, for example, fiber-reinforced plastic.

The superconducting wire 12 is line shaped, for example. The superconducting wire 12 is wound in a three-dimensional shape on the curved surface of the insulating substrate 10, as illustrated in FIGS. 1A and 1B. In FIG. 1, a resin layer covering the superconducting wire 12 is not illustrated.

Figure 3:
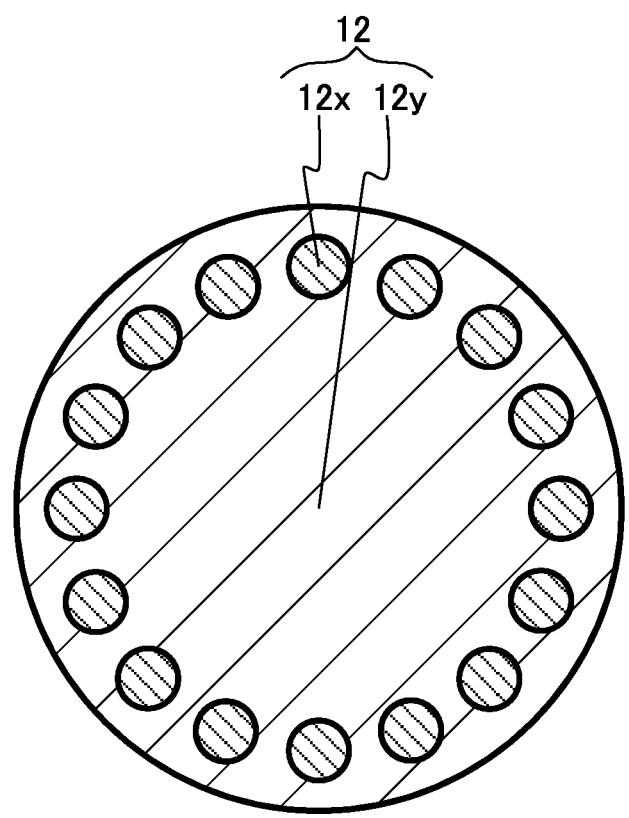
FIG. 3 is a schematic cross-sectional view illustrating a superconducting wire of the first embodiment.

FIG. 3 is a schematic cross-sectional view illustrating a superconducting wire of the first embodiment.

A cross section of the superconducting wire 12 is, for example, circular. A diameter of the superconducting wire 12 is, for example, 0.5 mm or more and 2 mm or less.

The superconducting wire 12 includes superconducting materials $12x$ and a metal matrix $12y$. The superconducting wire 12 has a structure in which a plurality of superconducting materials $12x$ are disposed in the metal matrix $12y$.

The superconducting material $12x$ is, for example, a low-temperature superconducting material having a critical temperature Tc of 8 K or higher and 40 K or lower. The superconducting material $12x$ is, for example, a niobium-titanium alloy-based, niobium-tin compound-based, niobium-aluminum compound-based, or magnesium diboride-based low-temperature superconducting material.

The metal matrix $12y$ is metal. The metal matrix $12y$ is, for example, copper.

As illustrated in FIG. 2, the superconducting wire 12 has a first region $12a$ and a second region $12b$. The second region $12b$ faces the first region $12a$. The first region $12a$ and the second region $12b$ are regions disposed adjacent to each other in parallel on the insulating substrate 10.

The first fixing resin layer 14 is disposed on the insulating substrate 10. The first fixing resin layer 14 surrounds the superconducting wire 12. The first fixing resin layer 14 has a function of bonding and fixing the superconducting wire 12 to the insulating substrate 10. Thickness of the first fixing resin layer 14 is, for example, 30 μm or more and 50 μm or less.

The inter-wire resin layer 16 is disposed on the insulating substrate 10. The inter-wire resin layer 16 is disposed between the first region $12a$ and second region $12b$ of the superconducting wire 12. The inter-wire resin layer 16 covers the first fixing resin layer 14. The inter-wire resin layer 16 is in contact with the first fixing resin layer 14.

The inter-wire resin layer 16 has a function of inhibiting the superconducting wire 12 from moving by vibration generated during use of the superconducting coil 100 or by electromagnetic force on the superconducting wire, and from being quenched by voltage generation or frictional heat caused by coil deformation. Further, the inter-wire resin layer 16 has a function of providing insulation between portions of the superconducting wire 12.

The second fixing resin layer 18 is disposed on the insulating substrate 10. The second fixing resin layer 18 is continuously disposed in layers on a surface of the insulating substrate 10.

The second fixing resin layer 18 is disposed between the insulating substrate 10 and the first fixing resin layer 14. The second fixing resin layer 18 is disposed between the insulating substrate 10 and the inter-wire resin layer 16. The second fixing resin layer 18 is in contact with the first fixing resin layer 14. The second fixing resin layer 18 is in contact with the inter-wire resin layer 16.

The second fixing resin layer 18 has a function of, along with the first fixing resin layer 14, bonding and fixing the superconducting wire 12 to the insulating substrate 10. Thickness of the second fixing resin layer 18 is, for example, 30 µm or more and 200 µm or less.

The coating resin layer 20 is disposed on the insulating substrate 10. The coating resin layer 20 is disposed between the superconducting wire 12 and the first fixing resin layer 14. The coating resin layer 20 surrounds the superconducting wire 12. The coating resin layer 20 is in contact with the first fixing resin layer 14.

The coating resin layer 20 has a function of coating and protecting the superconducting wire 12. Thickness of the coating resin layer 20 is, for example, 30 µm or more and 100 µm or less.

Figure 4A:
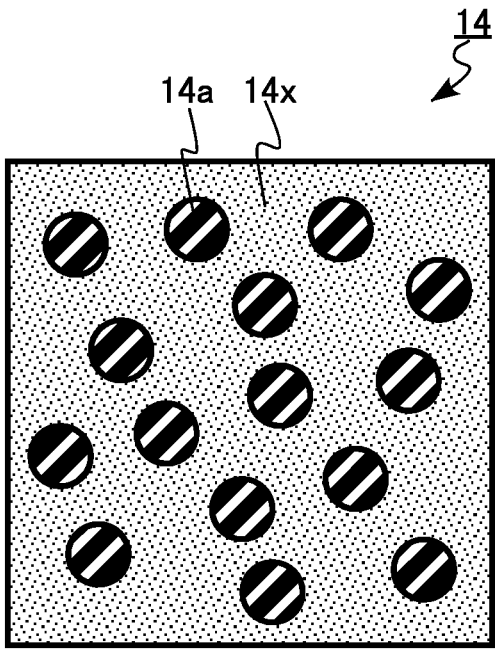
FIGS. 4A, 4B, 4C, and 4D are explanatory diagrams of a first to fourth resin layers of the first embodiment.
Figure 4B:
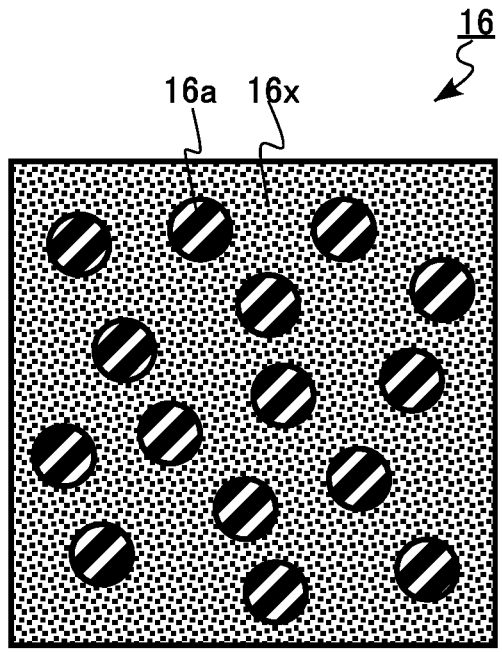
Figure 4C:
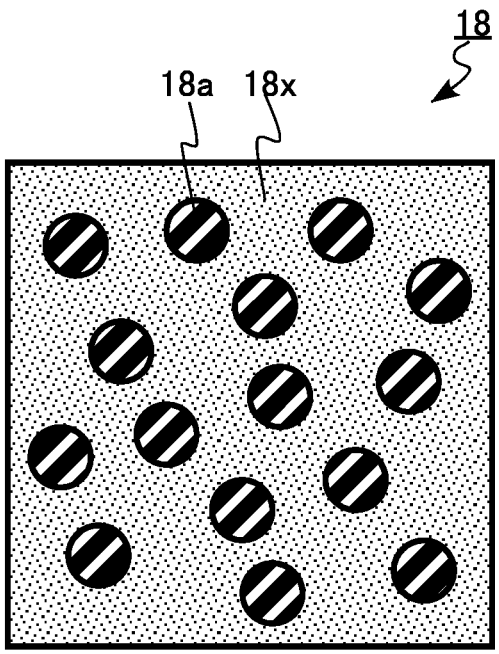
Figure 4D:
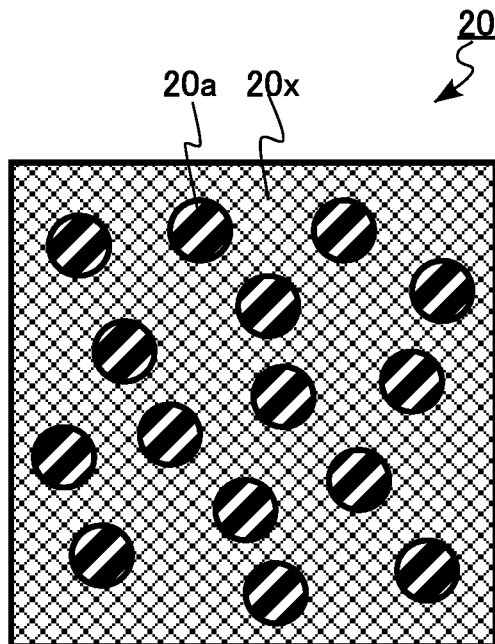

FIGS. 4A, 4B, 4C, and 4D are explanatory diagrams of the first to fourth resin layers of the first embodiment. FIG. 4A is an enlarged schematic cross-sectional view of a part of the first resin layer, that is, the first fixing resin layer 14. FIG. 4B is an enlarged schematic cross-sectional view of a part of the second resin layer, that is, the inter-wire resin layer 16. FIG. 4C is an enlarged schematic cross-sectional view of a part of the third resin layer, that is, the second fixing resin layer 18. FIG. 4D is an enlarged schematic cross-sectional view of a part of the fourth resin layer, that is, the coating resin layer 20.

As illustrated in FIG. 4A, the first fixing resin layer 14 includes a plurality of first particles 14a and first resin 14x. The first resin 14x surrounds the first particles 14a. The first particles 14a are so-called filler.

The first resin 14x is, for example, thermoplastic resin. The first resin 14x is, for example, phenoxy resin.

Material of the first resin 14x can be identified by, for example, a Fourier transform infrared spectrometer (FT-IR).

The first particles 14a are inorganic. The first particles 14a include, for example, at least one inorganic substance selected from a group including silica, alumina, silicon nitride, and alumina nitride. For example, the at least one inorganic substance occupies 90% or more of volume of the first particles 14a.

A chemical composition of the first particles 14a can be determined by, for example, identifying crystal by an X-ray diffraction method. In a case where the first particles 14a have poor crystallinity, the chemical composition of the first particles 14a can be measured by observing a cross section of the first fixing resin layer 14 with a scanning electron microscope (SEM), and performing an elemental analysis with an energy dispersive X-ray spectroscopy (EDS).

A median particle diameter of the first particles 14a is, for example, 1 µm or more and 10 µm or less. The median particle diameter of the first particles 14a can be obtained from, for example, major axes of the plurality of first particles 14a which are measured with an image acquired by the SEM (an SEM image).

A shape of the first particles 14a is, for example, but not particularly limited to, a plate shape, a spherical shape, a bale shape, a spheroidal shape, a columnar shape, a fibrous shape, or an irregular shape. FIG. 4A exemplifies a case where the first particles 14a have a spherical shape.

Occupancy ratio of the first particles 14a in the first fixing resin layer 14 is, for example, 20% or more and 80% or less.

The occupancy ratio of the first particles 14a in the first fixing resin layer 14 is represented by, for example, a proportion of the first particles 14a occupying an area observed in the SEM image. The occupancy ratio of the first particles 14a can be obtained by, for example, an image analysis of the SEM image.

As illustrated in FIG. 4B, the inter-wire resin layer 16 includes a plurality of second particles 16a and second resin 16x. The second resin 16x surrounds the second particles 16a. The second particles 16a are so-called filler.

Material of the second resin 16x is different from material of the first resin 14x. A chemical composition of the second resin 16x may be different from a chemical composition of the first resin 14x. The second resin 16x is, for example, thermo-setting resin. The second resin 16x is, for example, epoxy resin, phenol resin, unsaturated polyester resin, silicone resin, urethane resin, urea resin, polyimide resin, or a melamine resin.

The second particles 16a are inorganic. The second particles 16a include, for example, at least one inorganic substance selected from a group including silica, alumina, silicon nitride, and alumina nitride. For example, the at least one inorganic substance occupies 90% or more of volume of the second particles 16a.

A median particle diameter of the second particles 16a is, for example, 1 µm or more and 10 µm or less.

A shape of the second particles 16a is, for example, but not particularly limited to, a plate shape, a spherical shape, a bale shape, a spheroidal shape, a columnar shape, a fibrous shape, or an irregular shape. FIG. 4B exemplifies a case where the second particles 16a have a spherical shape.

Occupancy ratio of the second particles 16a in the inter-wire resin layer 16 is, for example, 20% or more and 80% or less.

As illustrated in FIG. 4C, the second fixing resin layer 18 includes a plurality of third particles 18a and third resin 18x. The third resin 18x surrounds the third particles 18a. The third particles 18a are so-called filler.

Material of the third resin 18x is different from material of the second resin 16x. The third resin 18x is, for example, thermoplastic resin. Material of the third resin 18x is identical to material of the first resin 14x, for example. Glass transition temperature (Tg) of the third resin 18x is, for example, 200° C. or lower. The third resin 18x is, for example, phenoxy resin.

The third particles 18a are inorganic. The third particles 18a include, for example, at least one inorganic substance selected from a group including silica, alumina, silicon nitride, and alumina nitride. For example, the at least one inorganic substance occupies 90% or more of volume of the third particles 18a. Material of the third particles 18a is identical to material of the first particles 14a, for example.

A median particle diameter of the third particles 18a is, for example, 1 µm or more and 10 µm or less.

A shape of the third particles 18a is, for example, but not particularly limited to, a plate shape, a spherical shape, a bale shape, a spheroidal shape, a columnar shape, a fibrous shape, or an irregular shape. FIG. 4C exemplifies a case where the third particles 18a have a spherical shape.

Occupancy ratio of the third particles 18a in the second fixing resin layer 18 is, for example, 20% or more and 80% or less.

As illustrated in FIG. 4D, the coating resin layer 20 includes a plurality of fourth particles 20a and fourth resin 20x. The fourth resin 20x surrounds the fourth particles 20a. The fourth particles 20a are so-called filler.

Material of the fourth resin 20x is different from material of the first resin 14x. The fourth resin 20x is, for example, thermoplastic resin.

The fourth resin 20x is, for example, polyvinyl formal resin, polyvinyl fluoride resin, saturated polyester resin, or polyurethane resin.

The fourth particles 20a are inorganic. The fourth particles 20a include, for example, at least one inorganic substance selected from a group including silica, alumina, silicon nitride, and alumina nitride. For example, the at least one inorganic substance occupies 90% or more of volume of the fourth particles 20a.

A median particle diameter of the fourth particles 20a is, for example, 1 μm or more and 10 μm or less.

A shape of the fourth particles 20a is, for example, but not particularly limited to, a plate shape, a spherical shape, a bale shape, a spheroidal shape, a columnar shape, a fibrous shape, or an irregular shape. FIG. 4D exemplifies a case where the fourth particles 20a have a spherical shape.

Next, a method for manufacturing the superconducting coil 100 of the first embodiment will be described.

FIGS. 5, 6, 7, and 8 are schematic diagrams illustrating a method for manufacturing the superconducting coil of the first embodiment. FIGS. 5, 6, 7, and 8 illustrate a cross section corresponding to FIG. 2.

Figure 5:
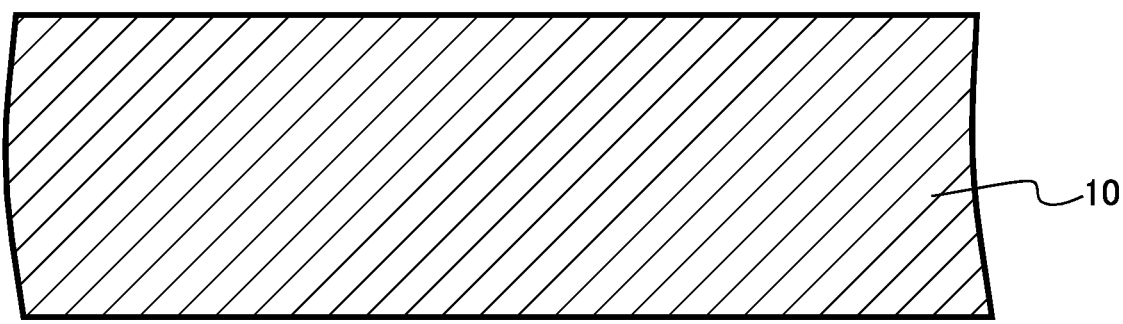
FIG. 5 is a schematic diagram illustrating preparation of an insulating substrate in a method for manufacturing the superconducting coil of the first embodiment.

First, the insulating substrate 10 is prepared (FIG. 5).

Figure 6:
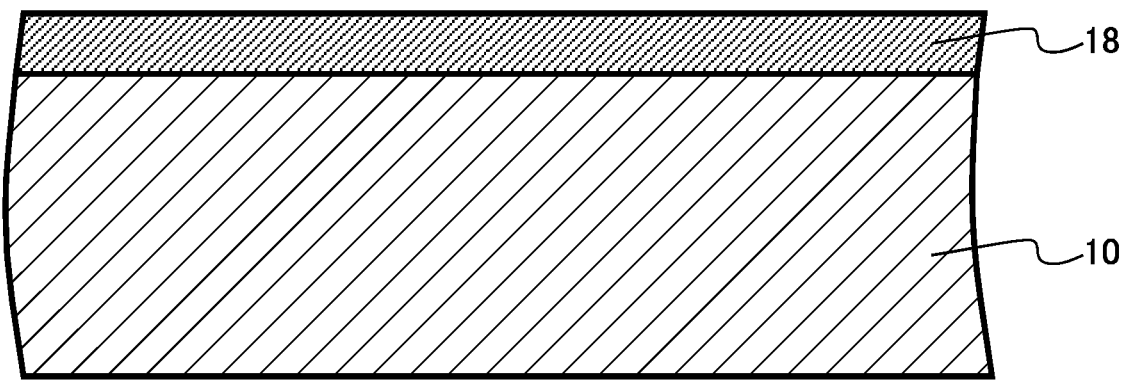
FIG. 6 is a schematic diagram illustrating application of a fixing resin layer in the method for manufacturing the superconducting coil of the first embodiment.

Next, the second fixing resin layer 18 is applied to the insulating substrate 10 (FIG. 6).

Figure 7:
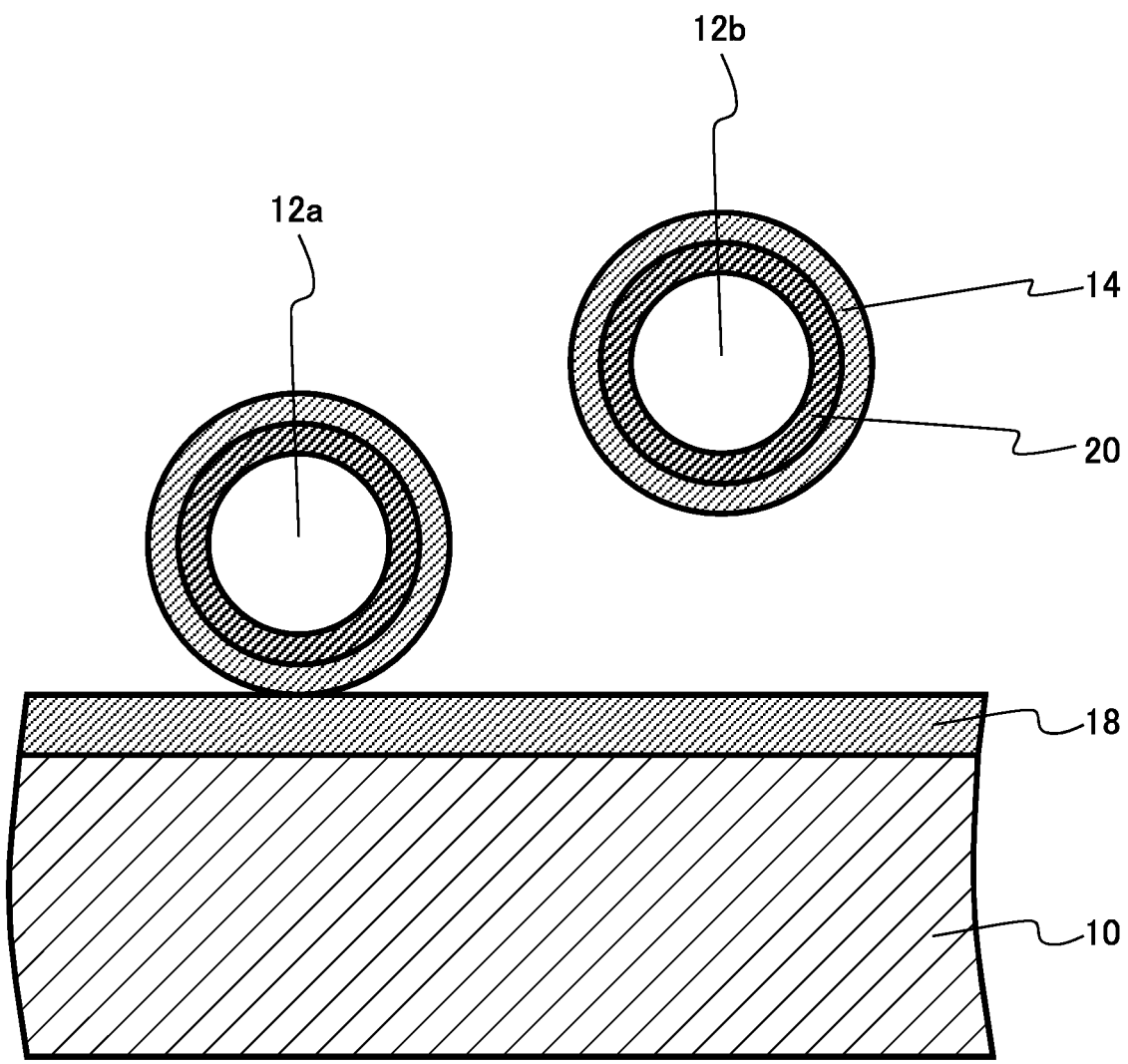
FIG. 7 is a schematic diagram illustrating disposition of the superconducting wire in the method for manufacturing the superconducting coil of the first embodiment.
Figure 8:
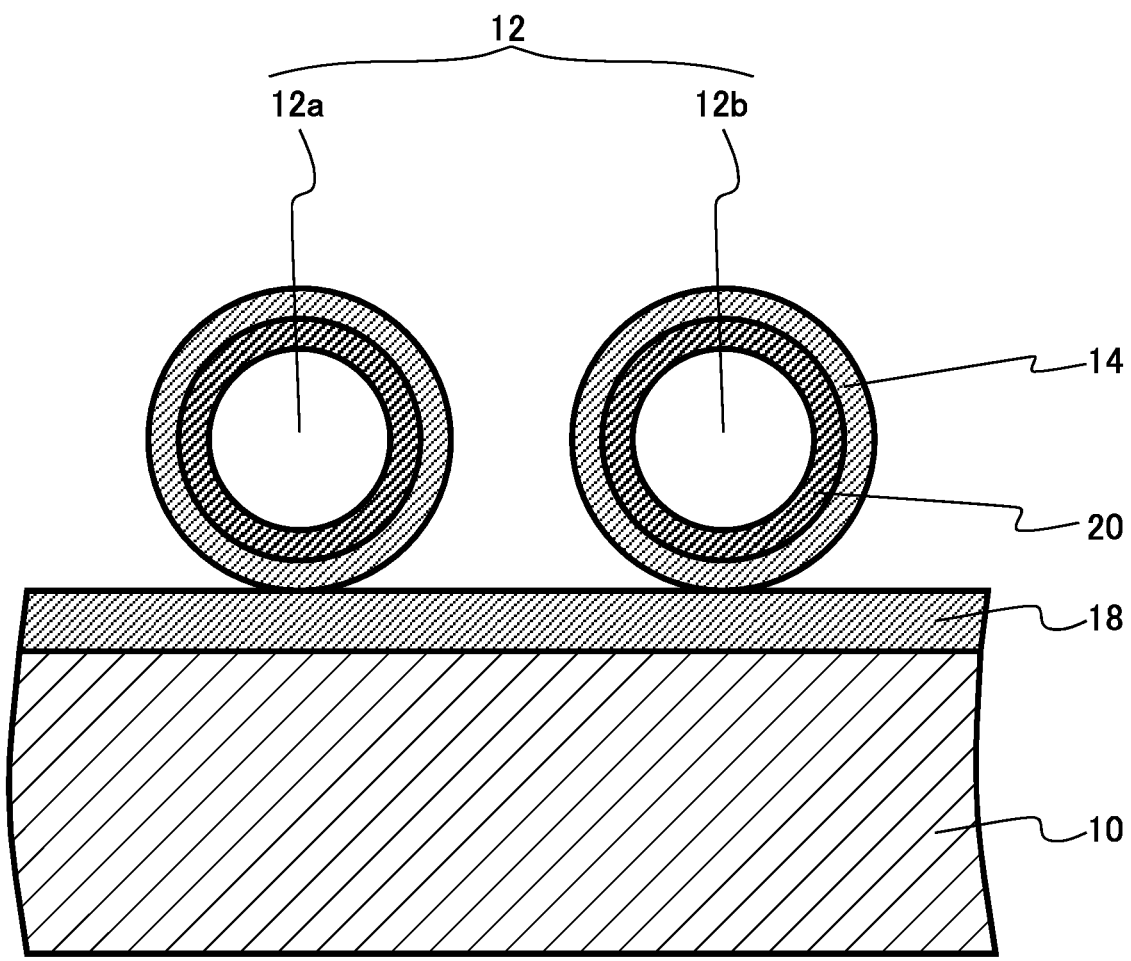
FIG. 8 is a schematic diagram illustrating disposition of portions of the superconducting wire adjacent to each other in the method for manufacturing the superconducting coil of the first embodiment.

Next, the superconducting wire 12 is disposed on a surface of the second fixing resin layer 18 of the insulating substrate 10 (FIG. 7). The superconducting wire 12 is wound such that a second region 12b of the superconducting wire 12 is disposed on the surface of the second fixing resin layer 18 so as to be substantially parallel to an adjacent first region 12a of the superconducting wire 12 previously disposed (FIG. 8). The coating resin layer 20 is formed on the superconducting wire 12 in advance.

The superconducting wire 12 on which the coating resin layer 20 is formed is passed through a tank filled with the first particles 14a and the first resin 14x to form the first fixing resin layer 14 of the coating resin layer 20. Then, the superconducting wire 12 is fixed to the surface of the second fixing resin layer 18 while, for example, the first fixing resin layer 14 is partially being softened by heat generated by ultrasonic irradiation.

After winding the superconducting wire 12 on the insulating substrate 10, the inter-wire resin layer 16 is applied to the superconducting wire 12. Because the superconducting wire 12 is fixed to the insulating substrate 10 with the first fixing resin layer 14 and the second fixing resin layer 18, a position of the superconducting wire 12 is less likely to shift when the inter-wire resin layer 16 is applied.

Then, the superconducting wire 12 is fixed to the insulating substrate 10 by the inter-wire resin layer 16 being thermally set. By using the above manufacturing method, the superconducting coil 100 illustrated in FIGS. 1A and 1B is formed.

Next, functions and effects of the superconducting coil 100 of the first embodiment will be described.

In order to reduce difference in thermal shrinkage between the metal included in the superconducting wire and the impregnated resin, inorganic filler is added to the impregnated resin. By adding the inorganic filler, difference in coefficient of thermal expansion between the metal included in the superconducting wire and the impregnated resin is reduced, and the difference in thermal shrinkage is reduced. Reduction of the difference in thermal shrinkage between the metal included in the superconducting wire and the impregnated resin reduces strain energy accumulated during cooling of the superconducting coil. Therefore, cracking is less likely to occur, and occurrence of quenching is suppressed.

Further, inclusion of filler in the impregnated resin increases fracture toughness of the impregnated resin. Even if strain energy accumulates, the increased fracture toughness of the impregnated resin reduces occurrence of cracking, and occurrence of quenching is suppressed.

Figure 9:
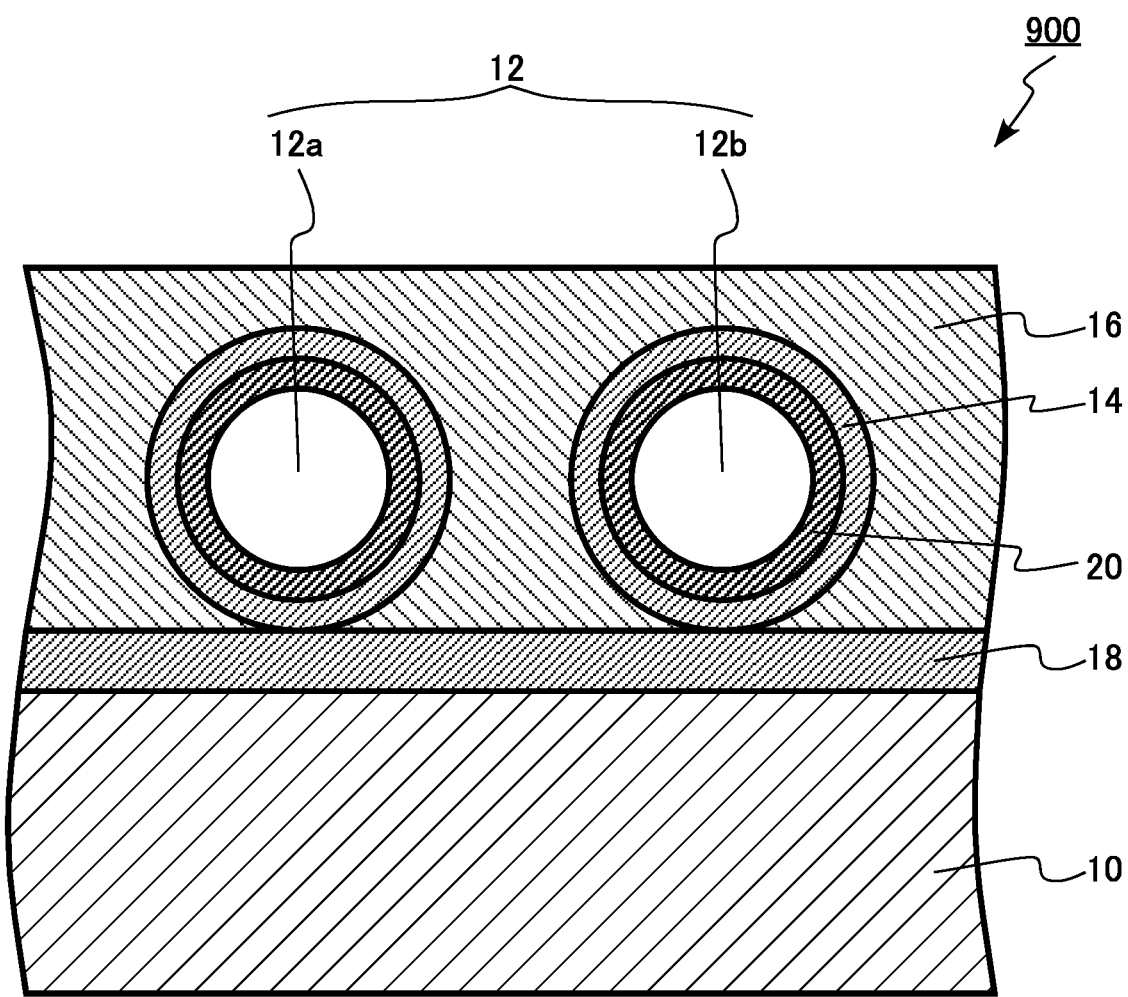
FIG. 9 is an enlarged schematic cross-sectional view illustrating a superconducting coil of a comparative example of the first embodiment.

FIG. 9 is an enlarged schematic cross-sectional view illustrating a superconducting coil of a comparative example of the first embodiment.

As similar to the superconducting coil 100 of the first embodiment, a superconducting coil 900 of the comparative example is a so-called saddle type coil.

The superconducting coil 900 of the comparative example includes, as similar to the superconducting coil of the first embodiment, an insulating substrate 10, a superconducting wire 12, a first fixing resin layer 14, an inter-wire resin layer 16, a second fixing resin layer 18, and a coating resin layer 20.

Figure 10A:
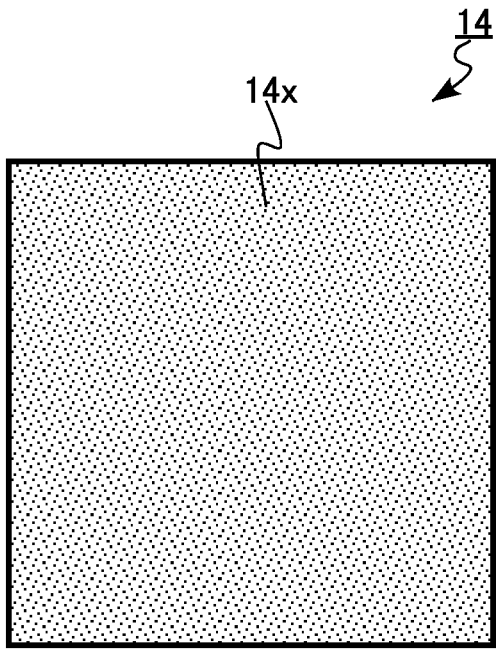
FIGS. 10A, 10B, 10C, and 10D are explanatory diagrams of a first to fourth resin layers of the comparative example of the first embodiment.
Figure 10B:
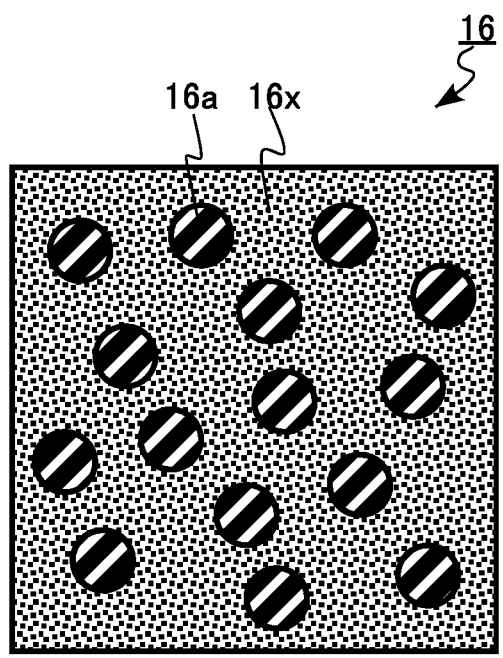
Figure 10C:
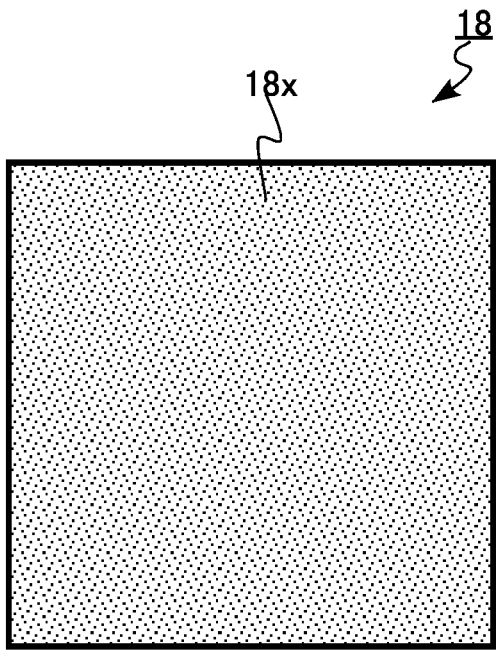
Figure 10D:
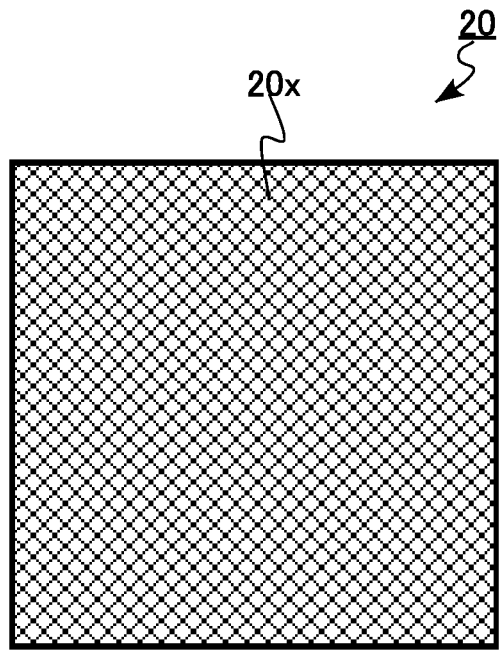

FIGS. 10A, 10B, 10C, and 10D are explanatory diagrams of a first to fourth resin layers of the comparative example of the first embodiment. FIG. 10A is an enlarged schematic cross-sectional view of a part of the first fixing resin layer 14. FIG. 10B is an enlarged schematic cross-sectional view of a part of the inter-wire resin layer 16. FIG. 10C is an enlarged schematic cross-sectional view of a part of the second fixing resin layer 18. FIG. 10D is an enlarged schematic cross-sectional view of a part of the coating resin layer 20.

As illustrated in FIGS. 10A, 10B, 10C, and 10D, the superconducting coil 900 of the comparative example is different from the superconducting coil 100 of the first embodiment in that the first fixing resin layer 14, the second fixing resin layer 18, and the coating resin layer 20 do not include filler.

In the superconducting coil 900 of the comparative example, the first fixing resin layer 14, the second fixing resin layer 18 and the coating resin layer 20 do not include filler. Therefore, when the superconducting coil 900 is cooled, the first fixing resin layer 14, the second fixing resin layer 18, and the coating resin layer 20 are likely to be subjected to cracking due to difference in coefficient of thermal expansion between the first fixing resin layer 14, the second fixing resin layer 18, or the coating resin layer 20, and the metal matrix 12y included in the superconducting wire 12.

Further, non-inclusion of filler causes insufficient fracture toughness of the first fixing resin layer 14, the second fixing resin layer 18, and the coating resin layer 20, cracking is likely to occur.

Therefore, in the superconducting coil 900 of the comparative example, quenching is likely to occur due to occurrence of cracking in the first fixing resin layer 14, the second fixing resin layer 18, or the coating resin layer 20. In particular, the first fixing resin layer 14 and the coating resin layer 20 are closer to the superconducting wire 12 than the inter-wire resin layer 16 is. Therefore, if cracking occurs in the first fixing resin layer 14 or the coating resin layer 20, quenching is more likely to occur.

In the superconducting coil 100 of the first embodiment, the first fixing resin layer 14, the second fixing resin layer 18 and the coating resin layer 20 include filler. Therefore, the difference in coefficient of thermal expansion between the first fixing resin layer 14, the second fixing resin layer 18, or the coating resin layer 20, and the metal matrix 12y included in the superconducting wire 12 is small, as compared to a case of the superconducting coil 900 of the comparative example. Further, fracture toughness of the first fixing resin layer 14, the second fixing resin layer 18, and the coating resin layer 20 is high, as compared to a case of the superconducting coil 900 of the comparative example. Therefore, as compared to a case of the superconducting coil 900 of the comparative example, occurrence of cracking is suppressed in the first fixing resin layer 14, the second fixing resin layer 18, and the coating resin layer 20, and occurrence of quenching is suppressed.

As described above, according to the first embodiment, a superconducting coil in which occurrence of quenching is suppressed can be implemented.

Second Embodiment

A superconducting coil of a second embodiment is different from the superconducting coil of the first embodiment in that a fourth resin layer does not include fourth particles. Hereinafter, a part of description of content overlapping content of the first embodiment will be omitted.

Figure 11A:
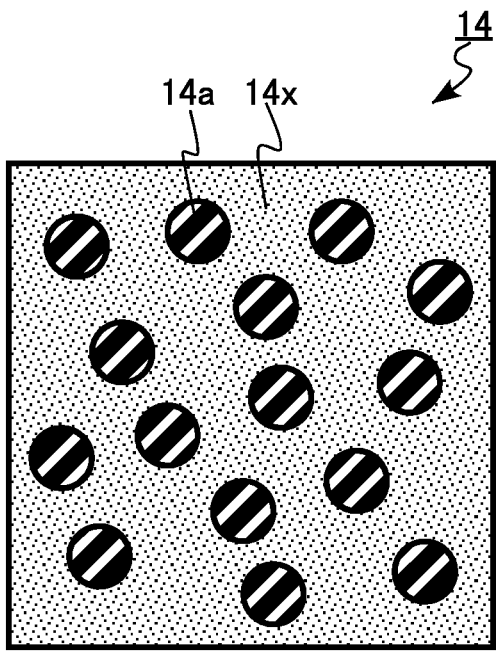
FIGS. 11A, 11B, 11C, and 11D are explanatory diagrams of a first to fourth resin layers of a second embodiment.
Figure 11B:
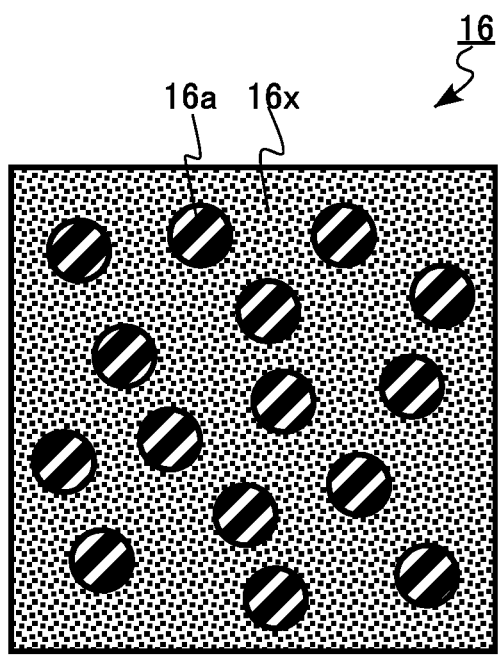
Figure 11C:
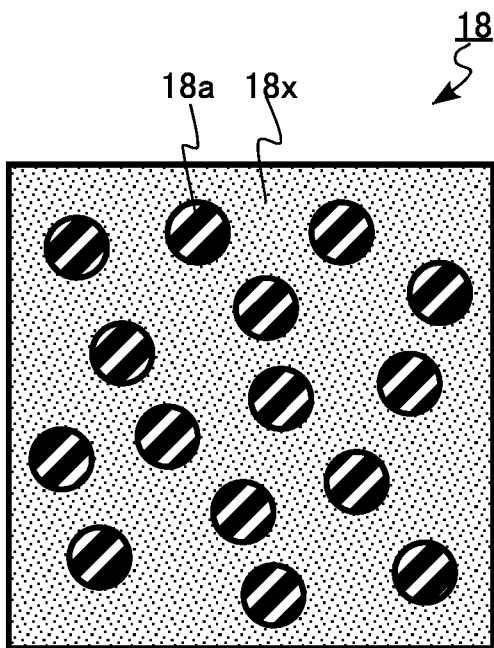
Figure 11D:
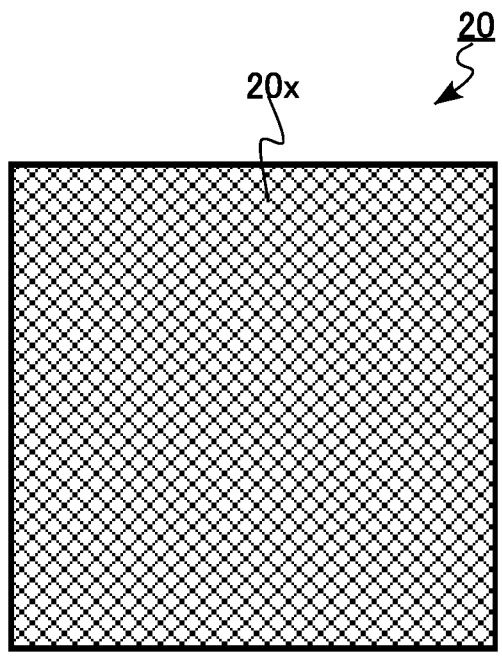

FIGS. 11A, 11B, 11C, and 11D are explanatory diagrams of first to fourth resin layers of the second embodiment. FIG. 11A is an enlarged schematic cross-sectional view of a part of the first resin layer, that is, a first fixing resin layer 14. FIG. 11B is an enlarged schematic cross-sectional view of a part of the second resin layer, that is, an inter-wire resin layer 16. FIG. 11C is an enlarged schematic cross-sectional view of a part of the third resin layer, that is, a second fixing resin layer 18. FIG. 11D is an enlarged schematic cross-sectional view of a part of the fourth resin layer, that is, a coating resin layer 20.

As illustrated in FIG. 11D, the coating resin layer 20 does not include filler.

In the superconducting coil of the second embodiment, the first fixing resin layer 14 and the second fixing resin layer 18 include filler. Therefore, as compared to a case of the superconducting coil 900 of the comparative example, occurrence of cracking is suppressed in the first fixing resin layer 14 and the second fixing resin layer 18, and occurrence of quenching is suppressed.

As described above, according to the second embodiment, a superconducting coil in which occurrence of quenching is suppressed can be implemented.

Third Embodiment

A superconducting coil of a third embodiment is different from the superconducting coil of the first embodiment in that particle diameter distribution of first particles is bimodal. Hereinafter, a part of description of content overlapping content of the first embodiment will be omitted.

Figure 12A:
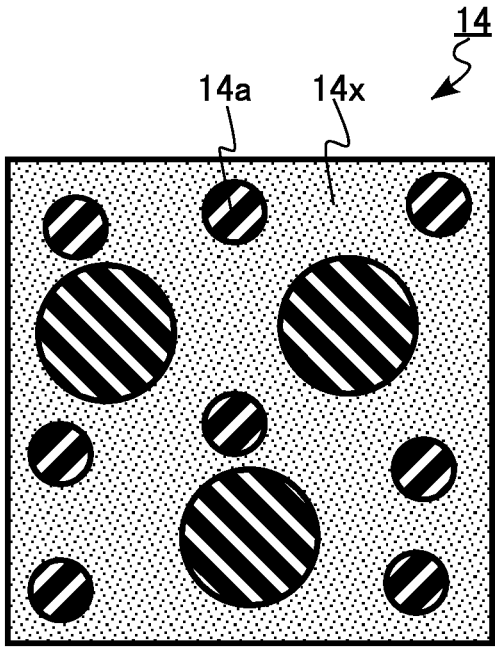
FIGS. 12A, 12B, 12C, and 12D are explanatory diagrams of a first to fourth resin layers of a third embodiment.
Figure 12B:
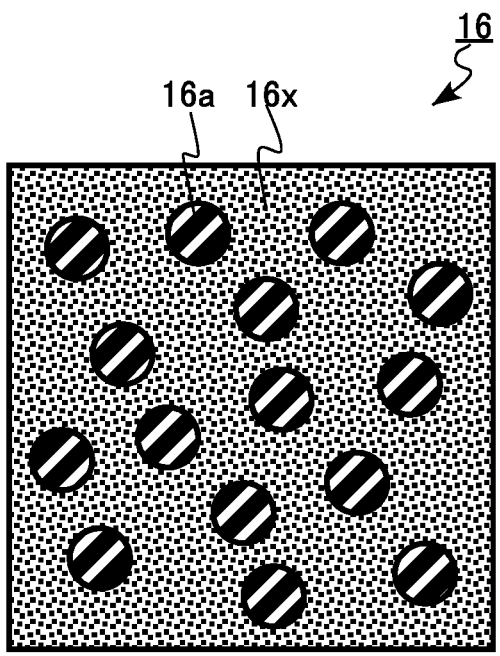
Figure 12C:
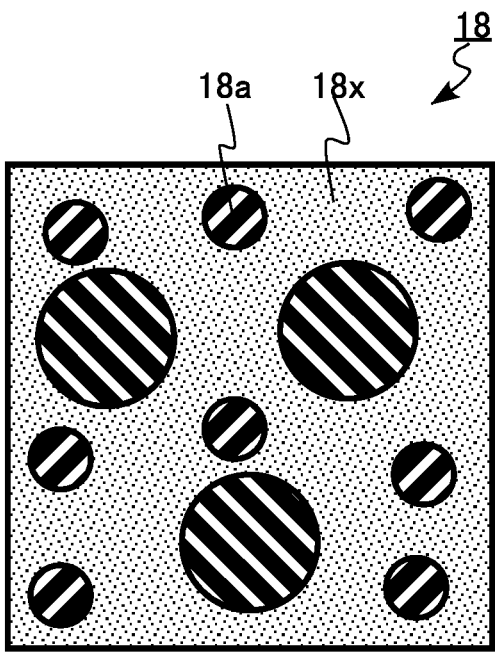
Figure 12D:
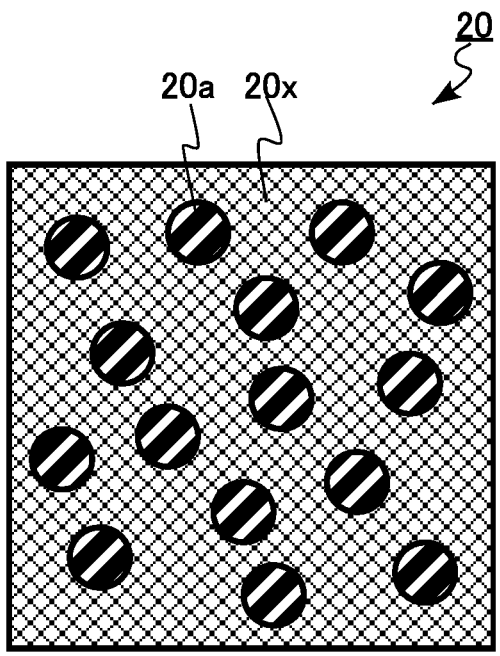

FIGS. 12A, 12B, 12C, and 12D are explanatory diagrams of first to fourth resin layers of the third embodiment. FIG. 12A is an enlarged schematic cross-sectional view of a part of the first resin layer, that is, a first fixing resin layer 14. FIG. 12B is an enlarged schematic cross-sectional view of a part of the second resin layer, that is, an inter-wire resin layer 16. FIG. 12C is an enlarged schematic cross-sectional view of a part of the third resin layer, that is, a second fixing resin layer 18. FIG. 12D is an enlarged schematic cross-sectional view of a part of the fourth resin layer, that is, a coating resin layer 20.

As illustrated in FIG. 12A, a plurality of first particles 14a included in the first fixing resin layer 14 include a large-sized particle and a small-sized particle. Particle diameter distribution of the first particles 14a is bimodal.

Whether or not the particle diameter distribution of the first particles 14a is bimodal can be determined by measuring major axes of the first particles 14a with an SEM image, and obtaining frequency distribution of the major axes of the first particles 14a.

In the particle diameter distribution of the first particles 14a, a particle diameter indicating a first peak is, for example, 1 µm or more and 10 µm or less, and a particle diameter indicating a second peak is, for example, 10 µm or more and 50 µm or less.

Because the particle diameter distribution of the first particles 14a is bimodal, fracture toughness of the first fixing resin layer 14 is high.

As illustrated in FIG. 12C, a plurality of third particles 18a included in the second fixing resin layer 18 include a large-sized particle and a small-sized particle. Particle diameter distribution of the third particles 18a is bimodal.

Because the particle diameter distribution of the third particles 18a is bimodal, fracture toughness of the second fixing resin layer 18 is high.

In a case of the superconducting coil of the third embodiment, as compared to a case of the superconducting coil 100 of the first embodiment, occurrence of cracking is further suppressed in the first fixing resin layer 14 and the second fixing resin layer 18. Therefore, occurrence of quenching is further suppressed.

As described above, according to the third embodiment, a superconducting coil in which occurrence of quenching is further suppressed can be implemented.

Fourth Embodiment

A superconducting coil of a fourth embodiment is different from the superconducting coil of the first embodiment in that a median particle diameter of first particles is smaller than a median particle diameter of second particles. Hereinafter, a part of description of content overlapping content of the first embodiment will be omitted.

Figure 13A:
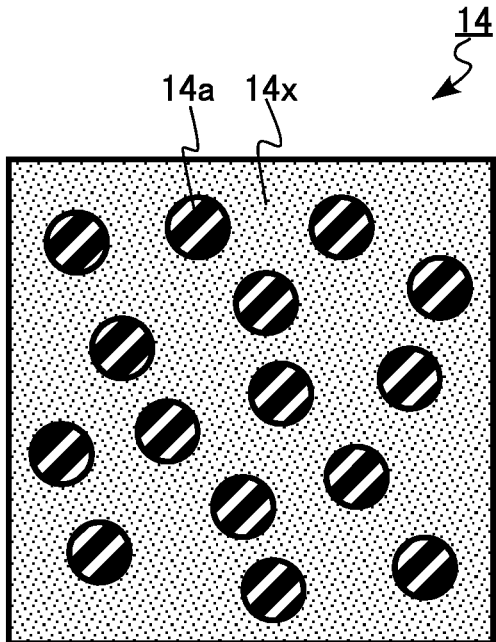
FIGS. 13A, 13B, 13C, and 13D are explanatory diagrams of a first to fourth resin layers of a fourth embodiment.
Figure 13B:
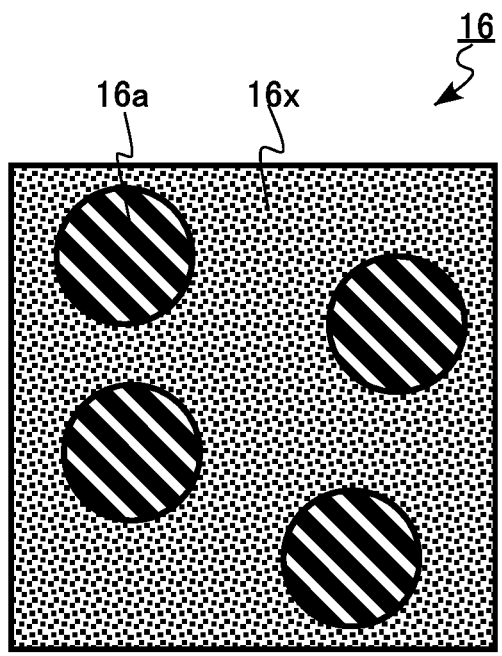
Figure 13C:
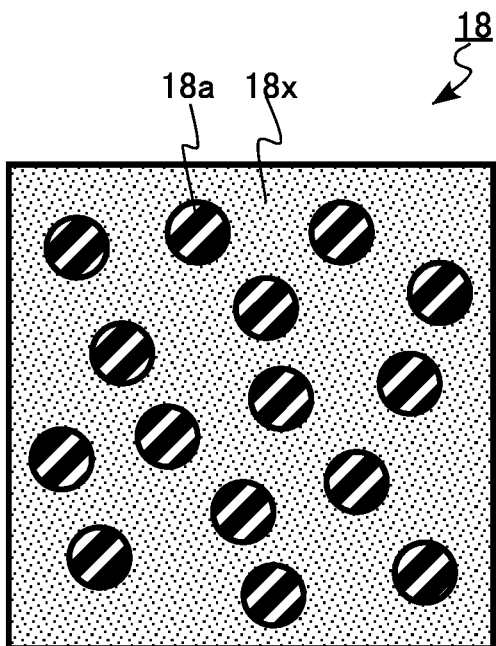
Figure 13D:
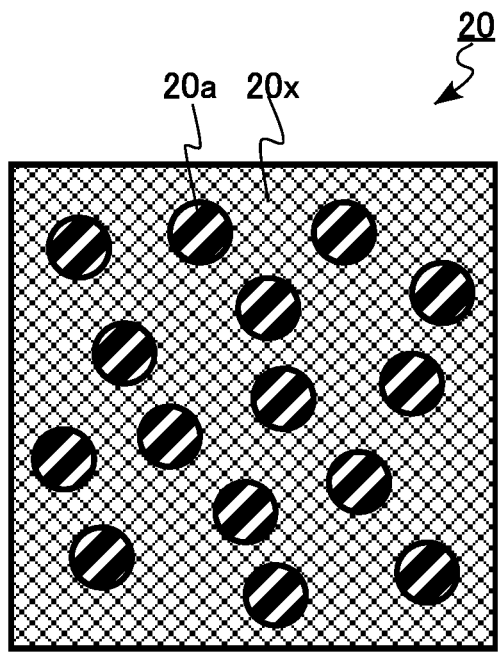

FIGS. 13A, 13B, 13C, and 13D are explanatory diagrams of first to fourth resin layers of the fourth embodiment. FIG. 13A is an enlarged schematic cross-sectional view of a part of the first resin layer, that is, a first fixing resin layer 14. FIG. 13B is an enlarged schematic cross-sectional view of a part of the second resin layer, that is, an inter-wire resin layer 16. FIG. 13C is an enlarged schematic cross-sectional view of a part of the third resin layer, that is, a second fixing resin layer 18. FIG. 13D is an enlarged schematic cross-sectional view of a part of the fourth resin layer, that is, a coating resin layer 20.

As illustrated in FIGS. 13A and 13B, a particle diameter of a plurality of first particles 14a included in the first fixing resin layer 14 is smaller than a particle diameter of a plurality of second particles 16a included in the inter-wire resin layer 16. Therefore, a median particle diameter of the first particles 14a is smaller than a median particle diameter of the second particles 16a.

Because the median particle diameter of the first particles 14a is smaller than the median particle diameter of the second particles 16a, fracture toughness of the inter-wire resin layer 16 is lower than the fracture toughness of the inter-wire resin layer 16 of the first embodiment.

Because the fracture toughness of the inter-wire resin layer 16 is low, cracking is more likely to occur in the inter-wire resin layer 16, which is farther from a superconducting wire 12 than the first fixing resin layer 14 is. In other words, cracking is less likely to occur in the first fixing resin layer 14, which is closer to the superconducting wire 12.

Therefore, cracking is further less likely to occur in the first fixing resin layer 14, which is closer to the superconducting wire 12, as compared to a case of the superconducting coil 100 of the first embodiment. Therefore, occurrence of quenching is further suppressed.

As described above, according to the fourth embodiment, a superconducting coil in which occurrence of quenching is further suppressed can be implemented.

Fifth Embodiment

A superconducting coil of a fifth embodiment is different from the superconducting coil of the first embodiment in that occupancy ratio of first particles in a first resin layer is higher than occupancy ratio of second particles in a second resin layer. Hereinafter, a part of description of content overlapping content of the first embodiment will be omitted.

Figure 14A:
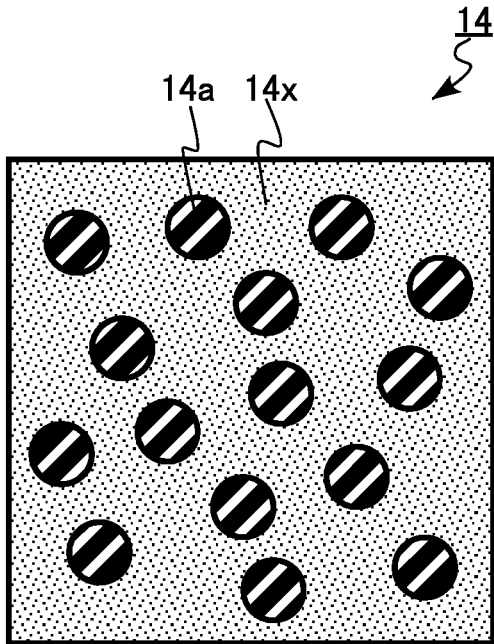
FIGS. 14A, 14B, 14C, and 14D are explanatory diagrams of a first to fourth resin layers of a fifth embodiment.
Figure 14B:
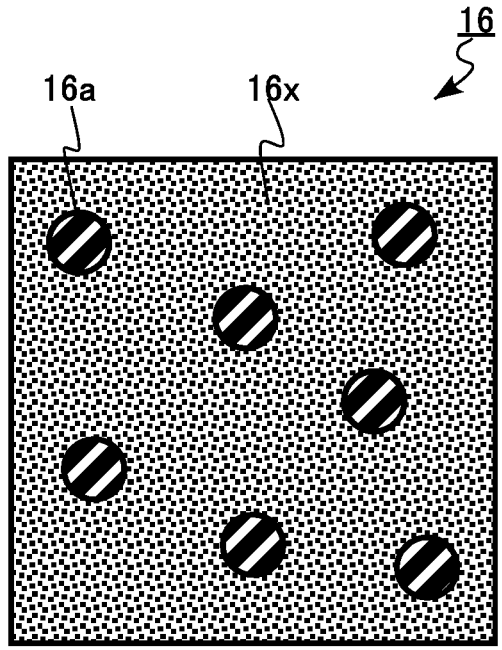
Figure 14C:
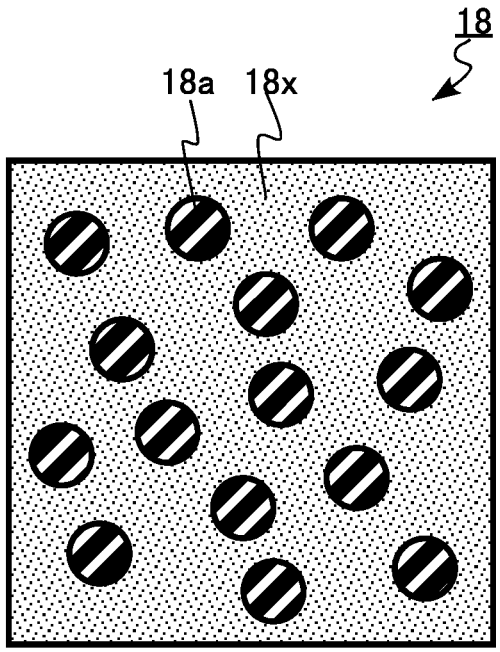
Figure 14D:
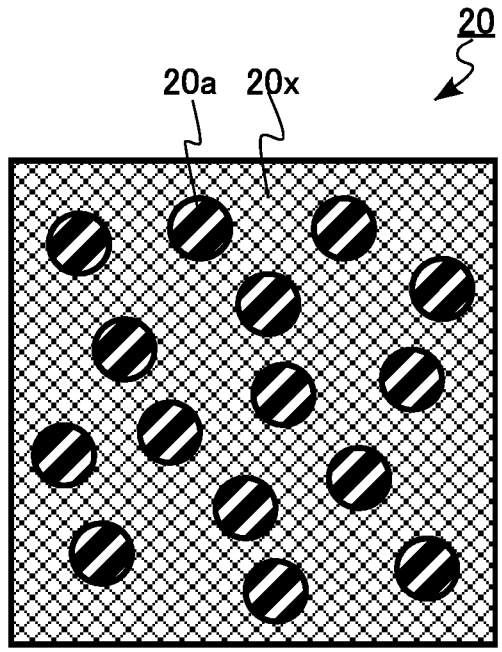

FIGS. 14A, 14B, 14C, and 14D are explanatory diagrams of first to fourth resin layers of the fifth embodiment. FIG. 14A is an enlarged schematic cross-sectional view of a part of the first resin layer, that is, a first fixing resin layer 14. FIG. 14B is an enlarged schematic cross-sectional view of a part of the second resin layer, that is, an inter-wire resin layer 16. FIG. 14C is an enlarged schematic cross-sectional view of a part of the third resin layer, that is, a second fixing resin layer 18. FIG. 14D is an enlarged schematic cross-sectional view of a part of the fourth resin layer, that is, a coating resin layer 20.

As illustrated in FIGS. 14A and 14B, occupancy ratio of a plurality of first particles 14a included in the first fixing resin layer 14 is higher than occupancy ratio of a plurality of second particles 16a included in the inter-wire resin layer 16.

Because the occupancy ratio of the first particles 14a is higher than the occupancy ratio of the second particles 16a, fracture toughness of the inter-wire resin layer 16 is lower than the fracture toughness of the inter-wire resin layer 16 of the first embodiment.

Because the fracture toughness of the inter-wire resin layer 16 is low, cracking is more likely to occur in the inter-wire resin layer 16, which is farther from a superconducting wire 12 than the first fixing resin layer 14 is. In other words, cracking is less likely to occur in the first fixing resin layer 14, which is closer to the superconducting wire 12.

Therefore, cracking is further less likely to occur in the first fixing resin layer 14, which is closer to the superconducting wire 12, as compared to a case of the superconducting coil 100 of the first embodiment. Therefore, occurrence of quenching is further suppressed.

As described above, according to the fifth embodiment, a superconducting coil in which occurrence of quenching is further suppressed can be implemented.

Sixth Embodiment

A superconducting coil of a sixth embodiment is different from the superconducting coil of the first embodiment in that second particles include crystal having cleavage. Hereinafter, a part of description of content overlapping content of the first embodiment will be omitted.

Figure 15A:
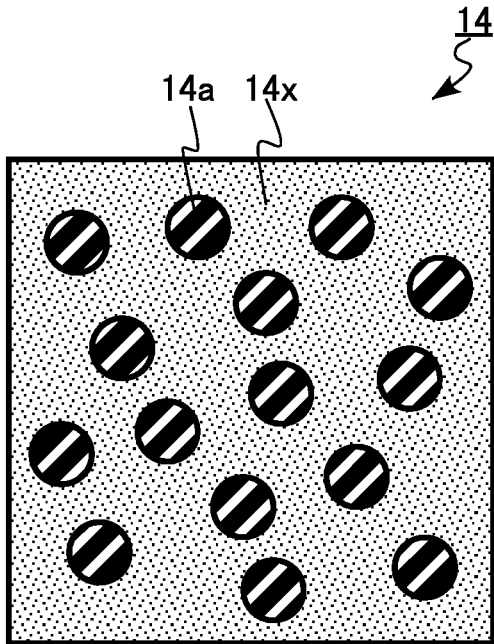
FIGS. 15A, 15B, 15C, and 15D are explanatory diagrams of a first to fourth resin layers of a sixth embodiment.
Figure 15B:
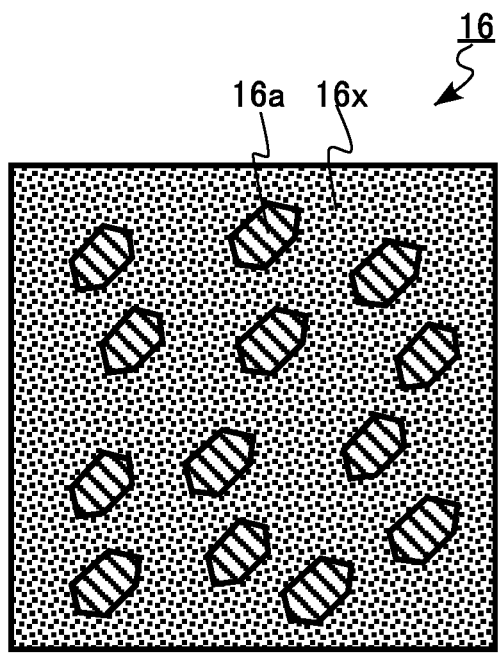
Figure 15C:
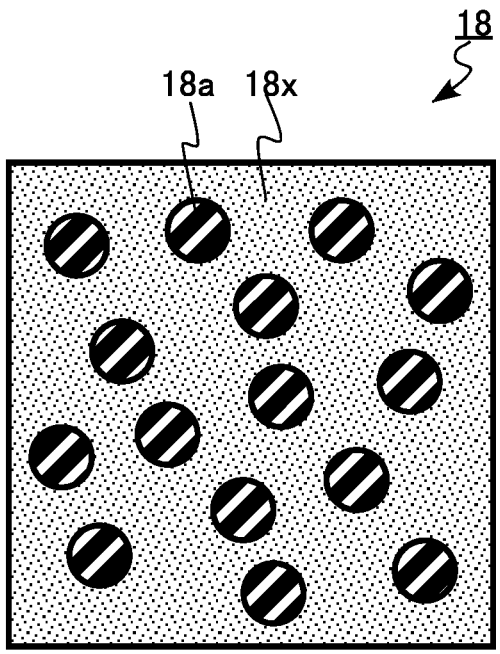
Figure 15D:
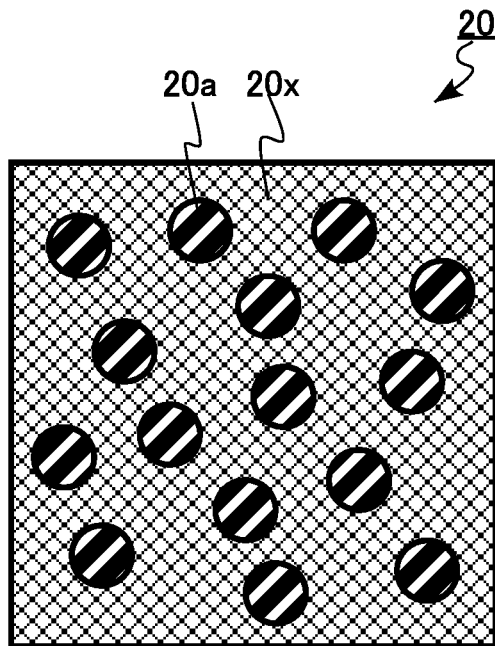

FIGS. 15A, 15B, 15C, and 15D are explanatory diagrams of first to fourth resin layers of the sixth embodiment. FIG. 15A is an enlarged schematic cross-sectional view of a part of the first resin layer, that is, a first fixing resin layer 14. FIG. 15B is an enlarged schematic cross-sectional view of a part of the second resin layer, that is, an inter-wire resin layer 16. FIG. 15C is an enlarged schematic cross-sectional view of a part of the third resin layer, that is, a second fixing resin layer 18. FIG. 15D is an enlarged schematic cross-sectional view of a part of the fourth resin layer, that is, a coating resin layer 20.

A plurality of second particles 16a included in the inter-wire resin layer 16 include crystal having cleavage.

The second particles 16a have volume resistivity of $10^{-2}$ $\Omega \cdot m$ or more and include crystal having cleavage. The crystal is a main component of the second particles 16a. The crystal occupies 90% or more of volume of the second particles 16a. The second particles 16a are, for example, the crystal itself.

Cleavage is a property of crystal tending to break parallel to a specific crystal plane. Cleavage is classified as perfect, good, distinct, or indistinct, depending on a degree. The second particles 16a have, for example, perfect or distinct cleavage.

Volume resistivity and cleavage are physical properties unique to crystal. If the crystal included in the second particles 16a is identified, volume resistivity and cleavage of the crystal can be determined. The crystal included in the second particles 16a can be identified by, for example, a powder X-ray diffraction method.

The crystal included in the second particles 16a is, for example, at least either of phyllosilicate mineral or hexagonal boron nitride. Volume resistivity of the phyllosilicate mineral or the hexagonal boron nitride is, for example, $10^{-2}$ $\Omega \cdot m$ or more and $10^{15}$ $\Omega \cdot m$ or less. Further, the phyllosilicate mineral or the hexagonal boron nitride has cleavage.

The phyllosilicate mineral has a sheet structure formed by a two-dimensionally spread $SiO_2$ tetrahedra. The phyllosilicate mineral is plate-shaped or flake-shaped and has perfect or distinct cleavage parallel to a bottom surface.

The phyllosilicate mineral included in the second particles 16a is, for example, at least one of mineral belonging to the mica group, clay mineral, pyrophyllite, or talc. The mineral belonging to the mica group is, for example, muscovite, phlogopite or biotite. The clay mineral is, for example, kaolinite or montmorillonite.

A shape of the second particles 16a is, for example, but not particularly limited to, a plate shape, a spherical shape, a bale shape, a spheroidal shape, a columnar shape, a fibrous shape, or an irregular shape. FIG. 15B exemplifies a case where the second particles 16a have a plate shape.

Crystal having cleavage breaks by relatively little stress. Therefore, because the second particles 16a include crystal having cleavage, fracture toughness of the inter-wire resin layer 16 is lower than the fracture toughness of the inter-wire resin layer 16 of the first embodiment.

Because the fracture toughness of the inter-wire resin layer 16 is low, cracking is more likely to occur in the inter-wire resin layer 16, which is farther from a superconducting wire 12 than the first fixing resin layer 14 is. In other words, cracking is less likely to occur in the first fixing resin layer 14, which is closer to the superconducting wire 12.

Therefore, cracking is further less likely to occur in the first fixing resin layer 14, which is closer to the superconducting wire 12, as compared to a case of the superconducting coil 100 of the first embodiment. Therefore, occurrence of quenching is further suppressed.

The second particles 16a have volume resistivity of $10^{-2}$ Ω·m or more, and therefore insulation between portions of the superconducting wire 12 is secured.

As described above, according to the sixth embodiment, a superconducting coil in which occurrence of quenching is further suppressed can be implemented.

Seventh Embodiment

A superconducting coil of a seventh embodiment is different from the superconducting coil of the sixth embodiment in that second particles include a spherical particle. Hereinafter, a part of description of content overlapping content of the sixth embodiment will be omitted.

Figure 16A:
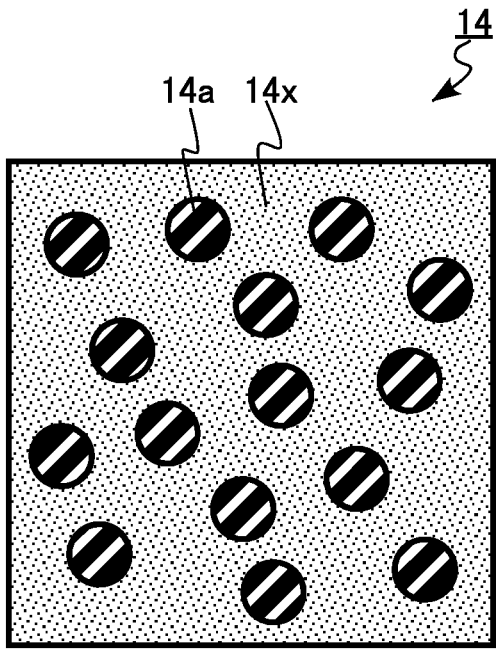
FIGS. 16A, 16B, 16C, and 16D are explanatory diagrams of a first to fourth resin layers of a seventh embodiment.
Figure 16B:
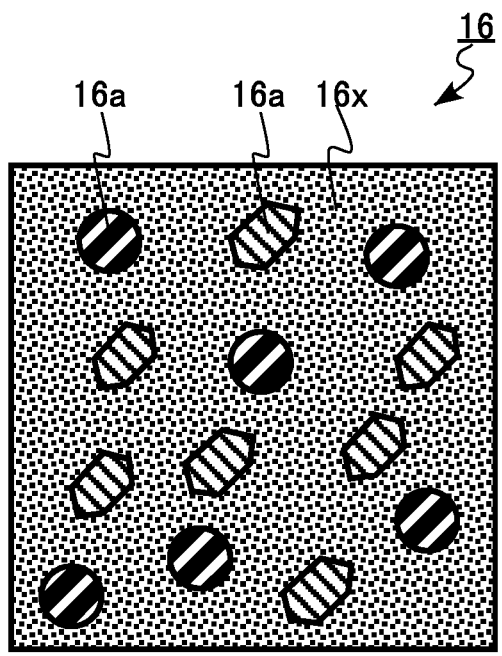
Figure 16C:
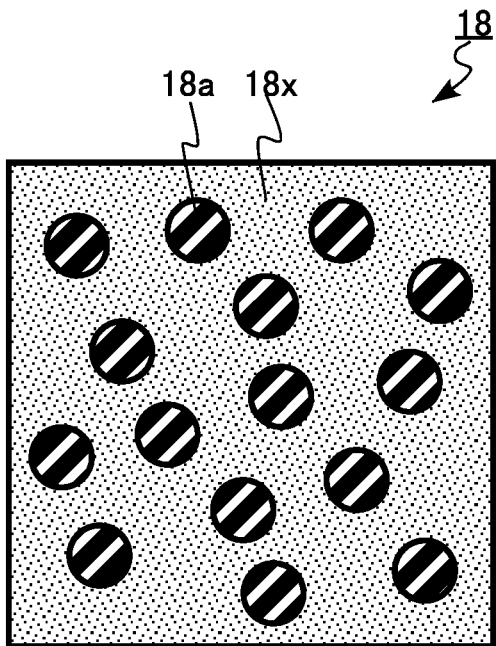
Figure 16D:
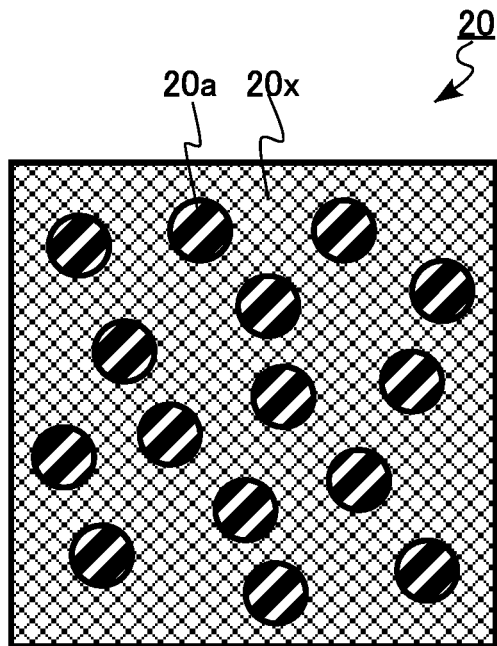

FIGS. 16A, 16B, 16C, and 16D are explanatory diagrams of first to fourth resin layers of the seventh embodiment. FIG. 16A is an enlarged schematic cross-sectional view of a part of the first resin layer, that is, a first fixing resin layer 14. FIG. 16B is an enlarged schematic cross-sectional view of a part of the second resin layer, that is, an inter-wire resin layer 16. FIG. 16C is an enlarged schematic cross-sectional view of a part of the third resin layer, that is, a second fixing resin layer 18. FIG. 16D is an enlarged schematic cross-sectional view of a part of the fourth resin layer, that is, a coating resin layer 20.

A plurality of second particles 16a included in the inter-wire resin layer 16 include crystal having cleavage and a spherical particle.

Because the second particles 16a include a spherical particle, fracture toughness is higher, as compared to a case where crystal having cleavage alone is included. Therefore, as compared to a case of the superconducting coil of the sixth embodiment, occurrence of quenching is further suppressed.

As described above, according to the seventh embodiment, a superconducting coil in which occurrence of quenching is further suppressed can be implemented.

Eighth Embodiment

A superconducting coil of an eighth embodiment is different from the superconducting coil of the first embodiment in having an irregular shape. Hereinafter, a part of description of content overlapping content of the first embodiment will be omitted.

Figure 17A:
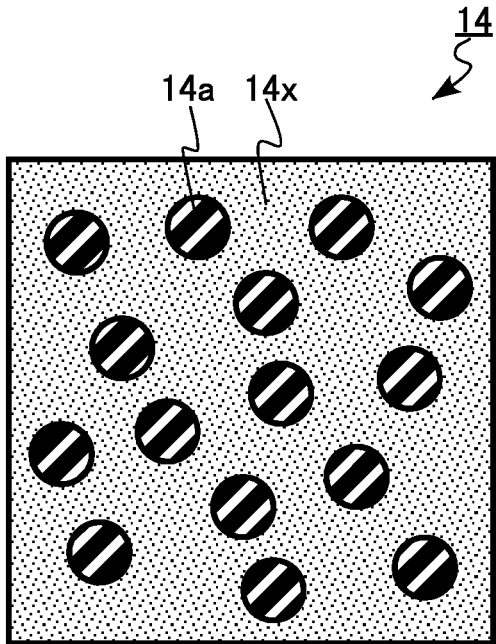
FIGS. 17A, 17B, 17C, and 17D are explanatory diagrams of a first to fourth resin layers of an eighth embodiment.
Figure 17B:
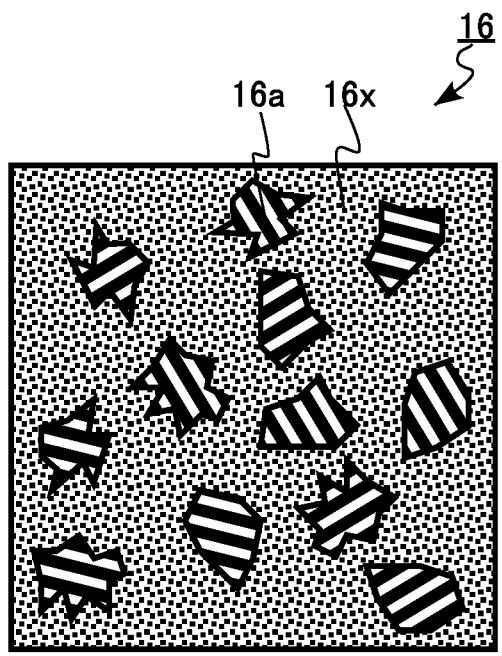
Figure 17C:
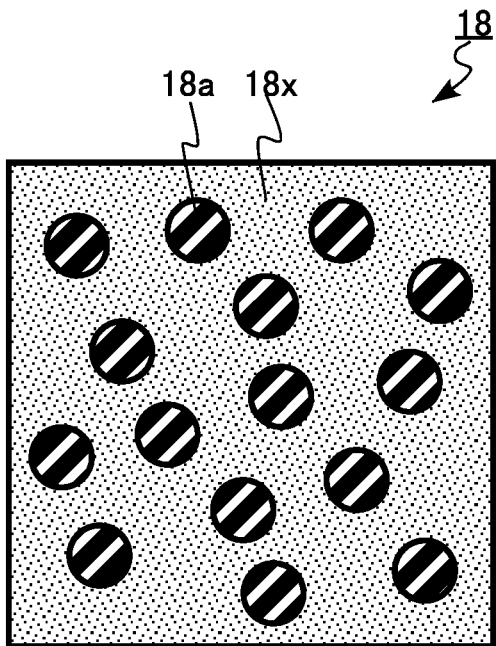
Figure 17D:
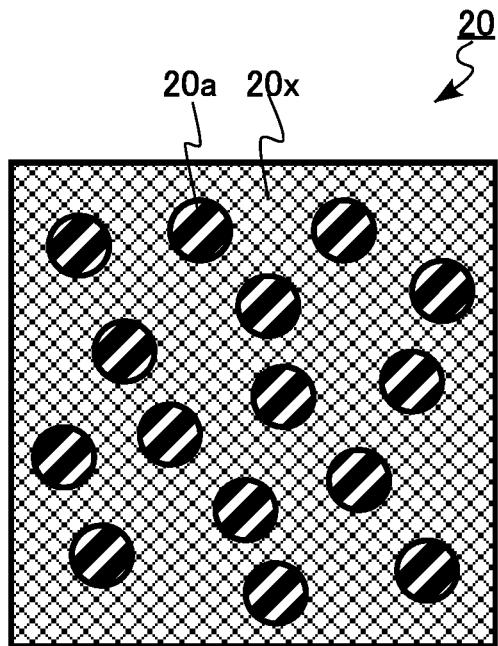

FIGS. 17A, 17B, 17C, and 17D are explanatory diagrams of first to fourth resin layers of the eighth embodiment. FIG. 17A is an enlarged schematic cross-sectional view of a part of the first resin layer, that is, a first fixing resin layer 14. FIG. 17B is an enlarged schematic cross-sectional view of a part of the second resin layer, that is, an inter-wire resin layer 16. FIG. 17C is an enlarged schematic cross-sectional view of a part of the third resin layer, that is, a second fixing resin layer 18. FIG. 17D is an enlarged schematic cross-sectional view of a part of the fourth resin layer, that is, a coating resin layer 20.

A plurality of second particles 16a included in the inter-wire resin layer 16 have an irregular shape. The second particles 16a are, for example, crushed silica.

A particle having an irregular shape breaks by relatively little stress, as compared to a spherical particle, for example. Therefore, because the second particles 16a have an irregular shape, fracture toughness of the inter-wire resin layer 16 is lower than the fracture toughness of the inter-wire resin layer 16 of the first embodiment.

Because the fracture toughness of the inter-wire resin layer 16 is low, cracking is more likely to occur in the inter-wire resin layer 16, which is farther from a superconducting wire 12 than the first fixing resin layer 14 is. In other words, cracking is less likely to occur in the first fixing resin layer 14, which is closer to the superconducting wire 12.

Therefore, cracking is further less likely to occur in the first fixing resin layer 14, which is closer to the superconducting wire 12, as compared to a case of the superconducting coil 100 of the first embodiment. Therefore, occurrence of quenching is further suppressed.

As described above, according to the eighth embodiment, a superconducting coil in which occurrence of quenching is further suppressed can be implemented.

Ninth Embodiment

A superconducting coil of a ninth embodiment includes a winding frame, a superconducting wire wound on the winding frame, the superconducting wire having a first region and a second region facing the first region, a first resin layer surrounding the superconducting wire and including a plurality of first particles and first resin surrounding the first particles, and a second resin layer positioned between the first region and the second region, the second resin layer covering the first resin layer and including a plurality of second particles and second resin surrounding the second particles and being made of material different from material of the first resin.

Figure 18:
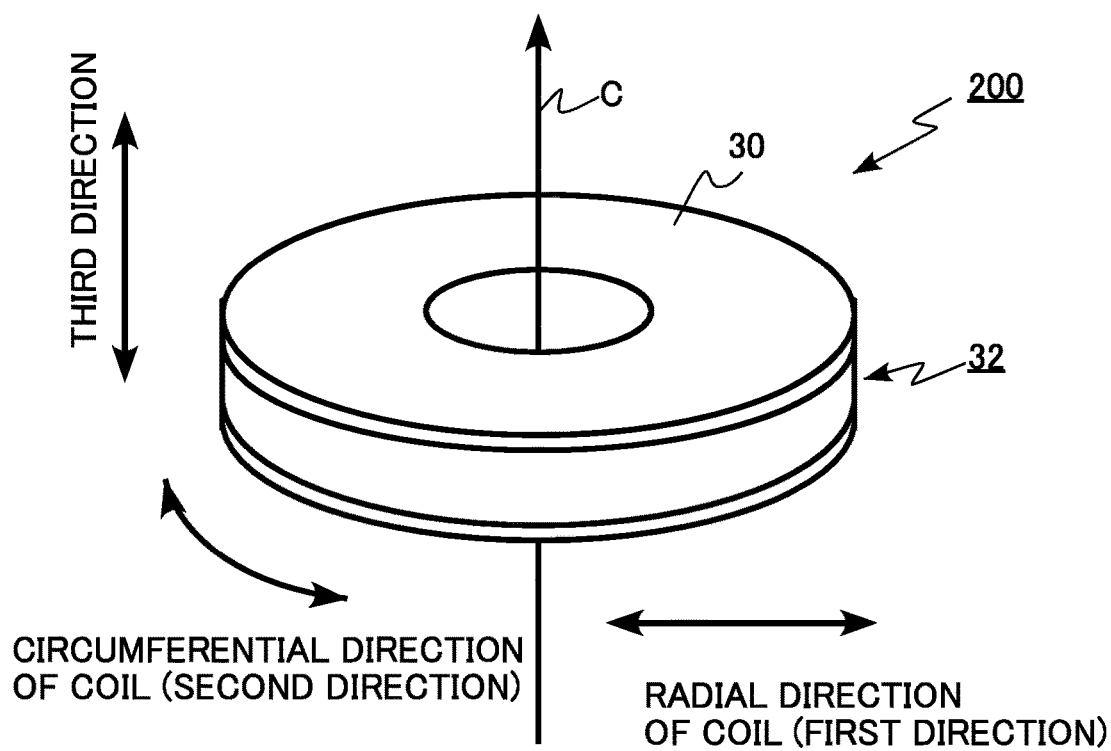
FIG. 18 is a schematic perspective view illustrating a superconducting coil of a ninth embodiment.
Figure 19:
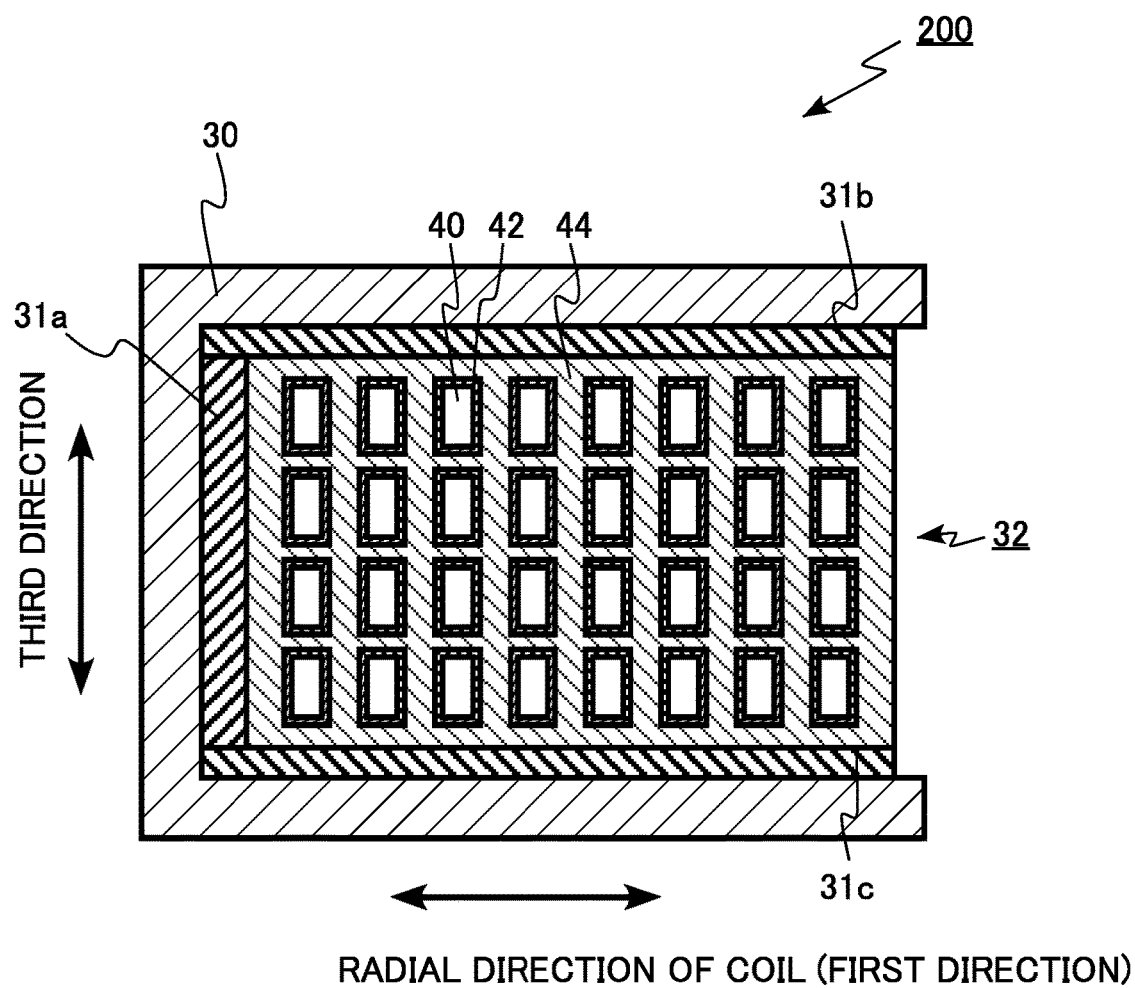
FIG. 19 is a schematic cross-sectional view illustrating the superconducting coil of the ninth embodiment.

FIG. 18 is a schematic perspective view illustrating the superconducting coil of the ninth embodiment. FIG. 19 is a schematic cross-sectional view illustrating the superconducting coil of the ninth embodiment.

A superconducting coil 200 of the ninth embodiment is used as a coil for, for example, magnetic field generation of a superconducting device, such as an NMR, an MRI, heavy particle therapy equipment, or a superconducting magnetic levitation railway vehicle. The superconducting coil 200 of the ninth embodiment is a so-called solenoid coil.

The superconducting coil 200 includes a winding frame 30, an inner peripheral insulation layer 31a, an upper insulation layer 31b, a lower insulation layer 31c, and a winding unit 32. The winding unit 32 includes a superconducting wire 40, a coating resin layer 42, and an inter-wire resin layer 44.

The coating resin layer 42 is an example of the first resin layer. The inter-wire resin layer 44 is an example of the second resin layer.

The inner peripheral insulation layer 31a, the upper insulation layer 31b, and the lower insulation layer 31c are formed of, for example, fiber-reinforced plastic. The inner peripheral insulation layer 31a, the upper insulation layer 31b, and the lower insulation layer 31c have a function of insulating the winding unit 32 from the winding frame 30 or an outside.

The superconducting wire 40 is linear shape, for example. The superconducting wire 40 is wound on the winding frame 30 in a solenoid shape around a winding center C.

Figure 20:
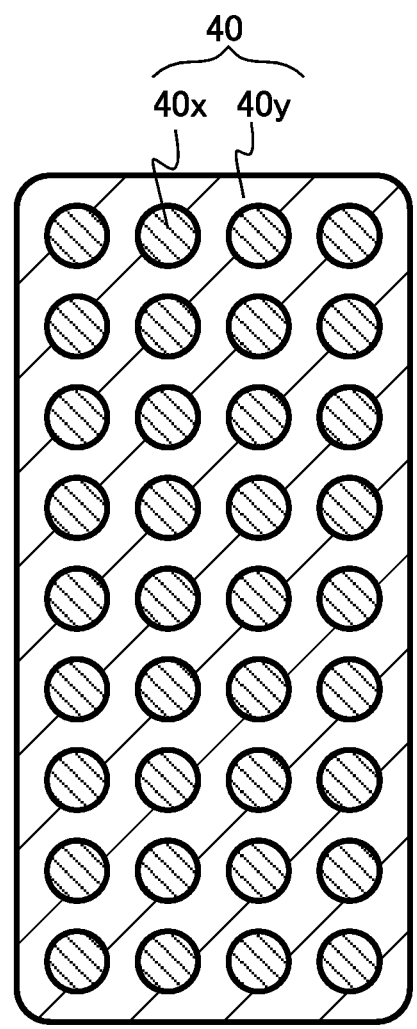
FIG. 20 is a schematic cross-sectional view illustrating a superconducting wire of the ninth embodiment.

FIG. 20 is a schematic cross-sectional view illustrating a superconducting wire of the ninth embodiment.

A cross section of the superconducting wire 40 is, for example, rectangular.

The superconducting wire 40 includes superconducting materials 40x and a metal matrix 40y. The superconducting wire 40 has a structure in which a plurality of superconducting materials 40x are disposed in the metal matrix 40y.

The superconducting material 40x is, for example, a low-temperature superconducting material having a critical temperature Tc of 8 K or higher and 40 K or lower. The superconducting material 12x is, for example, a niobium-titanium alloy-based, niobium-tin compound-based, niobium-aluminum compound-based, or magnesium diboride-based low-temperature superconducting material.

The metal matrix 40y is metal. The metal matrix 40y is, for example, copper.

Figure 21:
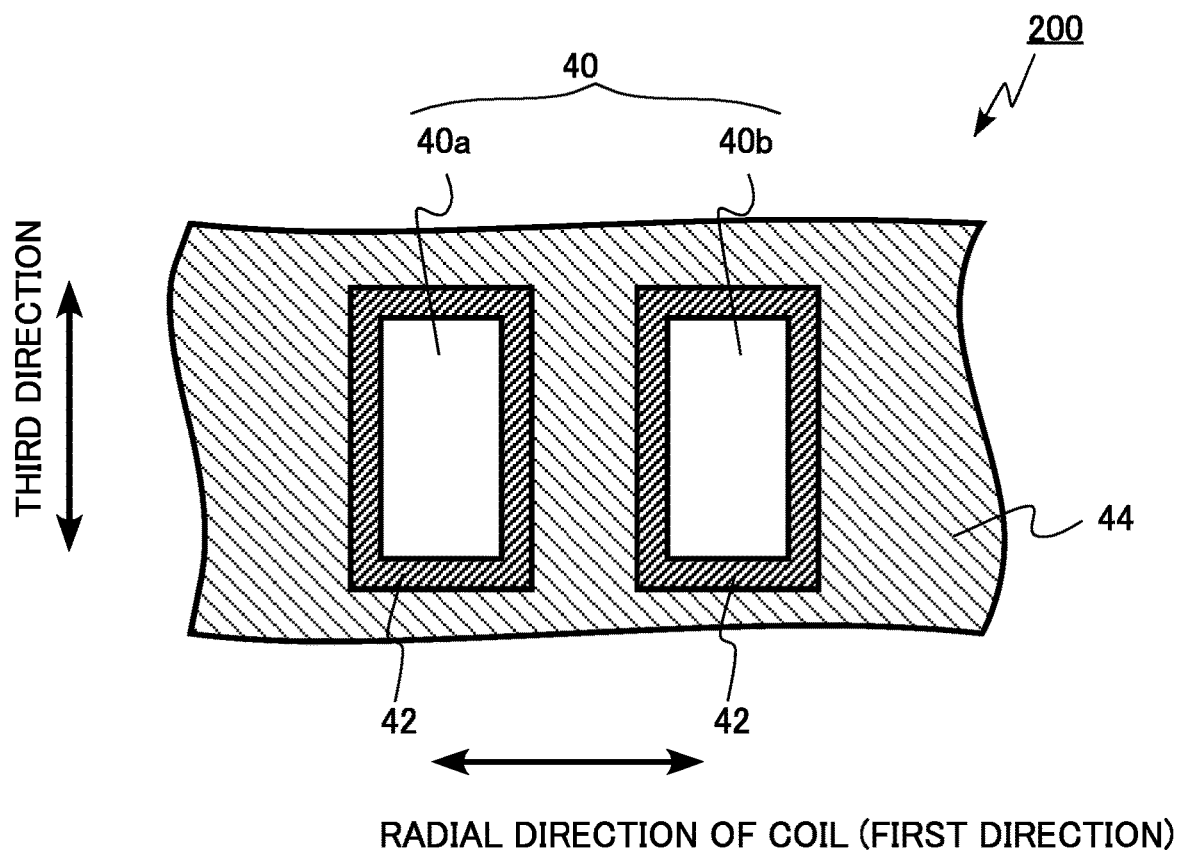
FIG. 21 is an enlarged schematic cross-sectional view illustrating a part of a winding unit of the superconducting coil of the ninth embodiment.

FIG. 21 is an enlarged schematic cross-sectional view illustrating a part of a winding unit of the superconducting coil of the ninth embodiment.

As illustrated in FIG. 21, the superconducting wire 40 has a first region 40a and a second region 40b. The first region 40a and the second region 40b are regions disposed adjacent to each other in parallel.

The coating resin layer 42 surrounds the superconducting wire 40. The coating resin layer 42 has a function of coating and protecting the superconducting wire 40. Thickness of the coating resin layer 42 is, for example, 30 μm or more and 100 μm or less.

The inter-wire resin layer 44 is disposed between the first region 40a and second region 40b of the superconducting wire 40. The inter-wire resin layer 44 covers the coating resin layer 42. The inter-wire resin layer 44 is in contact with the coating resin layer 42. The inter-wire resin layer 44 surrounds the coating resin layer 42, for example.

The inter-wire resin layer 44 has a function of inhibiting the superconducting wire 40 from moving by vibration generated during use of the superconducting coil 200 or by electromagnetic force on the superconducting wire, and from being quenched by voltage generation or frictional heat caused by coil deformation. Further, the inter-wire resin layer 44 has a function of providing insulation between portions of the superconducting wire 40.

Figure 22A:
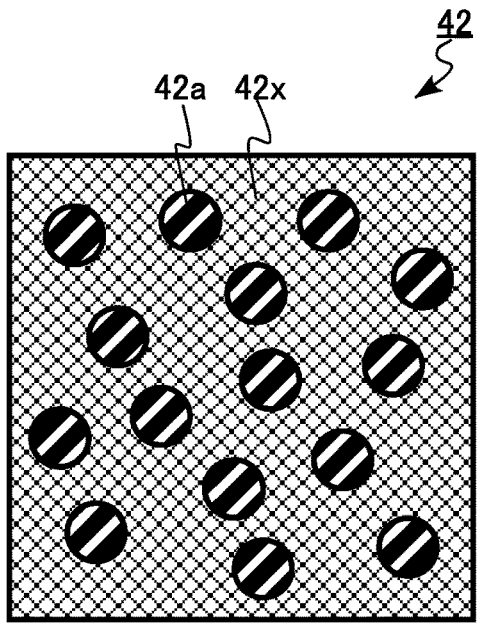
FIGS. 22A and 22B are explanatory diagrams of a first resin layer and second resin layer of the ninth embodiment.
Figure 22B:
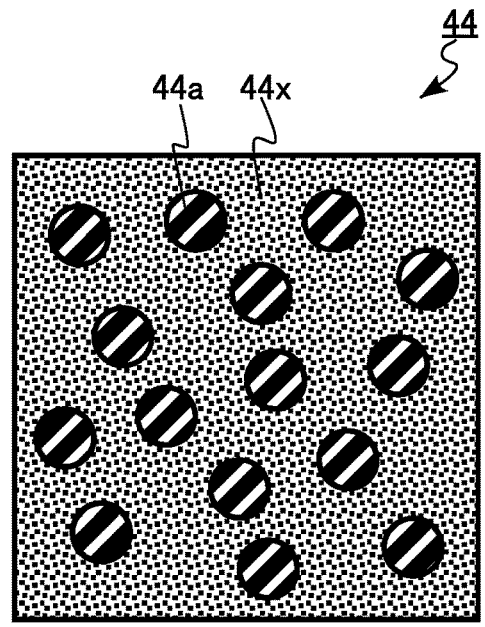

FIGS. 22A and 22B are explanatory diagrams of the first resin layer and the second resin layer of the ninth embodiment. FIG. 22A is an enlarged schematic cross-sectional view of a part of the first resin layer, that is, the coating resin layer 42. FIG. 22B is an enlarged schematic cross-sectional view of a part of the second resin layer, that is, the inter-wire resin layer 44.

As illustrated in FIG. 22A, the coating resin layer 42 includes a plurality of first particles 42a and first resin 42x. The first resin 42x surrounds the first particles 42a. The first particles 42a are so-called filler.

The first resin 42x is, for example, thermoplastic resin. The first resin 42x is, for example, polyvinyl formal resin.

Material of the first resin 42x can be identified by, for example, an FT-IR.

The first particles 42a are inorganic. The first particles 42a include, for example, at least one inorganic substance selected from a group including silica, alumina, silicon nitride, and alumina nitride. For example, the at least one inorganic substance occupies 90% or more of volume of the first particles 42a.

A chemical composition of the first particles 42a can be determined by, for example, identifying crystal by an X-ray diffraction method. In a case where the first particles 42a have poor crystallinity, the chemical composition of the first particles 42a can be measured by observing a cross section of the coating resin layer 42 with an SEM, and performing an elemental analysis with an EDS.

A median particle diameter of the first particles 42a is, for example, 1 μm or more and 10 μm or less. The median particle diameter of the first particles 42a can be obtained from, for example, major axes of the plurality of first particles 42a which are measured with an image acquired by the SEM (an SEM image).

A shape of the first particles 42a is, for example, but not particularly limited to, a plate shape, a spherical shape, a bale shape, a spheroidal shape, a columnar shape, a fibrous shape, or an irregular shape. FIG. 22A exemplifies a case where the first particles 42a have a spherical shape.

Occupancy ratio of the first particles 42a in the coating resin layer 42 is, for example, 20% or more and 80% or less.

The occupancy ratio of the first particles 42a in the coating resin layer 42 is represented by, for example, a proportion of the first particles 42a occupying an area observed in the SEM image. The occupancy ratio of the first particles 42a can be obtained by, for example, an image analysis of the SEM image.

As illustrated in FIG. 22B, the inter-wire resin layer 44 includes a plurality of second particles 44a and second resin 44x. The second resin 44x surrounds the second particles 44a. The second particles 44a are so-called filler.

Material of the second resin 44x is different from material of the first resin 42x. The second resin 44x is, for example, thermo-setting resin. The second resin 44x is, for example, epoxy resin.

The second particles 44a are inorganic. The second particles 44a include, for example, at least one inorganic substance selected from a group including silica, alumina, silicon nitride, and alumina nitride. For example, the at least one inorganic substance occupies 90% or more of volume of the second particles 44a.

A median particle diameter of the second particles 44a is, for example, 1 μm or more and 10 μm or less.

A shape of the second particles 44a is, for example, but not particularly limited to, a plate shape, a spherical shape, a bale shape, a spheroidal shape, a columnar shape, a fibrous shape, or an irregular shape. FIG. 22B exemplifies a case where the second particles 44a have a spherical shape.

Occupancy ratio of the second particles 44a in the inter-wire resin layer 44 is, for example, 20% or more and 80% or less.

When the superconducting coil 200 of the ninth embodiment is manufactured, the superconducting wire 40 coated by the coating resin layer 42 is wound on the winding frame 30 while the second resin 44x including the second particles 44a is being applied. Then, the inter-wire resin layer 44 is formed and a superconducting wire 12 is fixed by the second resin 44x being thermally set.

Next, functions and effects of the superconducting coil 200 of the ninth embodiment will be described.

In order to reduce difference in thermal shrinkage between the metal included in the superconducting wire and the impregnated resin, inorganic filler is added to the impregnated resin. By adding the inorganic filler, difference in coefficient of thermal expansion between the metal included in the superconducting wire and the impregnated resin is reduced, and the difference in thermal shrinkage is reduced. Reduction of the difference in thermal shrinkage between the metal included in the superconducting wire and the impregnated resin reduces strain energy accumulated during cooling of the superconducting coil. Therefore, cracking is less likely to occur, and occurrence of quenching is suppressed.

Further, inclusion of filler in the impregnated resin increases fracture toughness of the impregnated resin. Even if strain energy accumulates, the increased fracture toughness of the impregnated resin reduces occurrence of cracking, and occurrence of quenching is suppressed.

Figure 23:
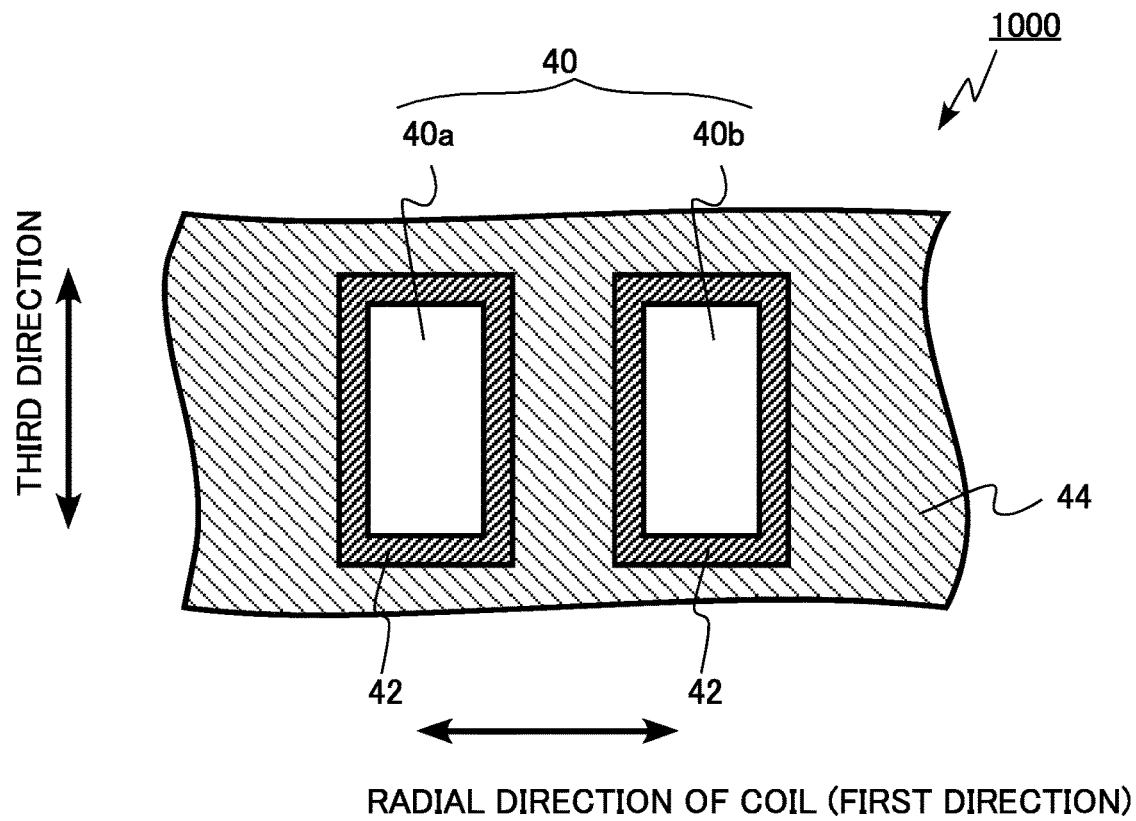
FIG. 23 is an enlarged schematic cross-sectional view illustrating a superconducting coil of a comparative example of the ninth embodiment.

FIG. 23 is an enlarged schematic cross-sectional view illustrating a superconducting coil of a comparative example of the ninth embodiment.

As similar to the superconducting coil 200 of the ninth embodiment, a superconducting coil 1000 of the comparative example is a so-called solenoid coil.

As similar to the superconducting coil 200 of the ninth embodiment, the superconducting coil 1000 of the comparative example includes a winding frame 30, an inner peripheral insulation layer 31a, an upper insulation layer 31b, a lower insulation layer 31c, and a winding unit 32. The winding unit 32 includes a superconducting wire 40, a coating resin layer 42, and an inter-wire resin layer 44.

Figure 24A:
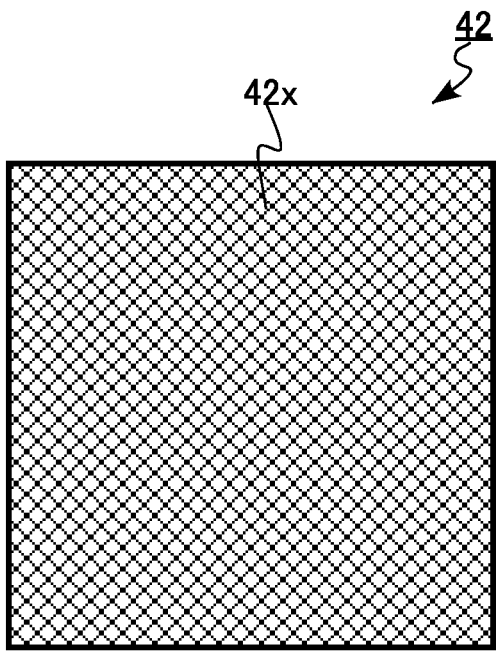
FIGS. 24A and 24B are explanatory diagrams of a first resin layer and second resin layer of the comparative example of the ninth embodiment.
Figure 24B:
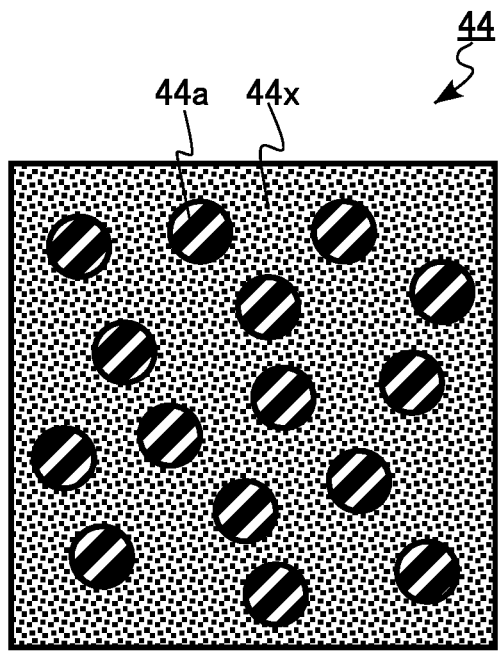

FIGS. 24A and 24B are explanatory diagrams of first resin layer and second resin layer of the comparative example of the ninth embodiment. FIG. 24A is an enlarged schematic cross-sectional view of a part of the first resin layer, that is, the coating resin layer 42. FIG. 24B is an enlarged schematic cross-sectional view of a part of the second resin layer, that is, the inter-wire resin layer 44.

As illustrated in FIG. 23, the superconducting coil 1000 of the comparative example is different from the superconducting coil 200 of the ninth embodiment in that the coating resin layer 42 does not include filler.

In the superconducting coil 1000 of the comparative example, the coating resin layer 42 does not include filler. Therefore, when the superconducting coil 1000 is cooled, the coating resin layer 42 is likely to be subjected to cracking due to difference in coefficient of thermal expansion between the coating resin layer 42 and the metal matrix 40y included in the superconducting wire 40. Further, fracture toughness of the coating resin layer 42 is insufficient, and cracking is likely to occur.

Therefore, the superconducting coil 1000 of the comparative example is likely to be subjected to quenching caused by occurrence of cracking in the coating resin layer 42. In particular, the coating resin layer 42 is closer to the superconducting wire 40 than the inter-wire resin layer 44 is. Therefore, if cracking occurs in the coating resin layer 42, quenching is more likely to occur.

In the superconducting coil 200 of the ninth embodiment, the coating resin layer 42 includes filler. Therefore, the difference in coefficient of thermal expansion between the coating resin layer 42 and the metal matrix 40y included in the superconducting wire 40 is small, as compared to a case of the superconducting coil 1000 of the comparative example. Further, the fracture toughness of the coating resin layer 42 is high, as compared to a case of the superconducting coil 1000 of the comparative example. Therefore, as compared to a case of the superconducting coil 1000 of the comparative example, occurrence of cracking is suppressed in the coating resin layer 42, and occurrence of quenching is suppressed.

As described above, according to the ninth embodiment, a superconducting coil in which occurrence of quenching is suppressed can be implemented.

Tenth Embodiment

A superconducting coil of a tenth embodiment is different from the superconducting coil of the ninth embodiment in that particle diameter distribution of first particles is bimodal. Hereinafter, a part of description of content overlapping content of the ninth embodiment will be omitted.

Figure 25A:
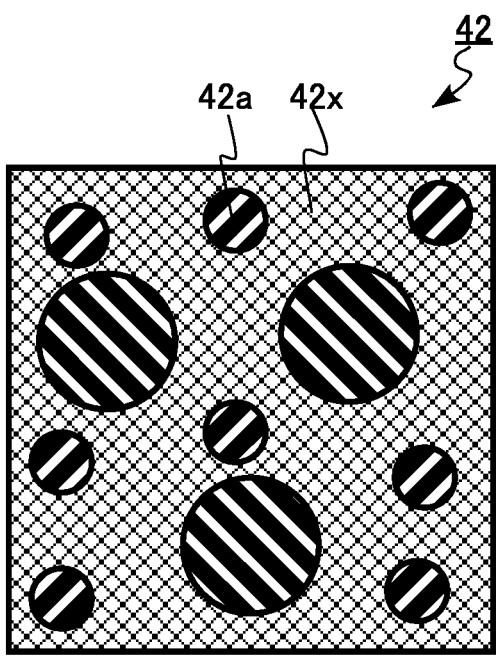
FIGS. 25A and 25B are explanatory diagrams of a first resin layer and a second resin layer of a tenth embodiment.
Figure 25B:
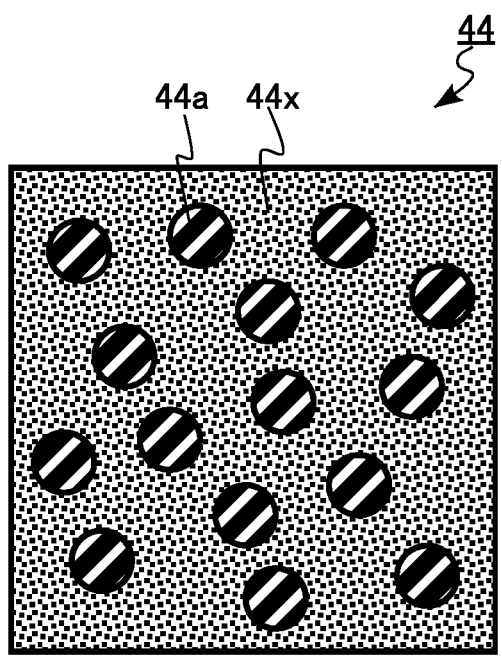

FIGS. 25A and 25B are explanatory diagrams of a first resin layer and second resin layer of the tenth embodiment. FIG. 25A is an enlarged schematic cross-sectional view of a part of the first resin layer, that is, a coating resin layer 42. FIG. 25B is an enlarged schematic cross-sectional view of a part of the second resin layer, that is, an inter-wire resin layer 44.

As illustrated in FIG. 25A, a plurality of first particles 42a included in the coating resin layer 42 include a large-sized particle and a small-sized particle. Particle diameter distribution of the first particles 42a is bimodal.

Whether or not the particle diameter distribution of the first particles 42a is bimodal can be determined by measuring major axes of the first particles 42a with an SEM image, and obtaining frequency distribution of the major axes of the first particles 42a.

In the particle diameter distribution of the first particles 42a, a particle diameter indicating a first peak is, for example, 1 µm or more and 10 µm or less, and a particle diameter indicating a second peak is, for example, 10 µm or more and 50 µm or less.

Because the particle diameter distribution of the first particles 42a is bimodal, fracture toughness of the coating resin layer 42 is high.

In a case of the superconducting coil of the tenth embodiment, as compared to a case of the superconducting coil 200 of the ninth embodiment, occurrence of cracking is further suppressed in the coating resin layer 42. Therefore, occurrence of quenching is further suppressed.

As described above, according to the tenth embodiment, a superconducting coil in which occurrence of quenching is further suppressed can be implemented.

Eleventh Embodiment

A superconducting coil of an eleventh embodiment is different from the superconducting coil of the ninth embodiment in that a median particle diameter of first particles is smaller than a median particle diameter of second particles. Hereinafter, a part of description of content overlapping content of the ninth embodiment will be omitted.

Figure 26A:
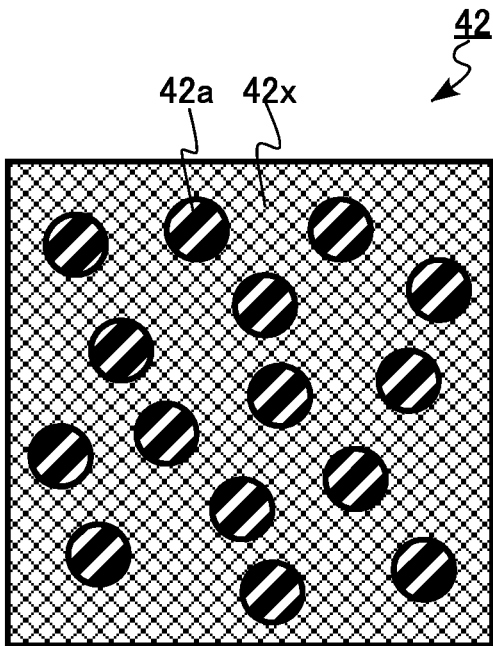
FIGS. 26A and 26B are explanatory diagrams of a first resin layer and a second resin layer of an eleventh embodiment.
Figure 26B:
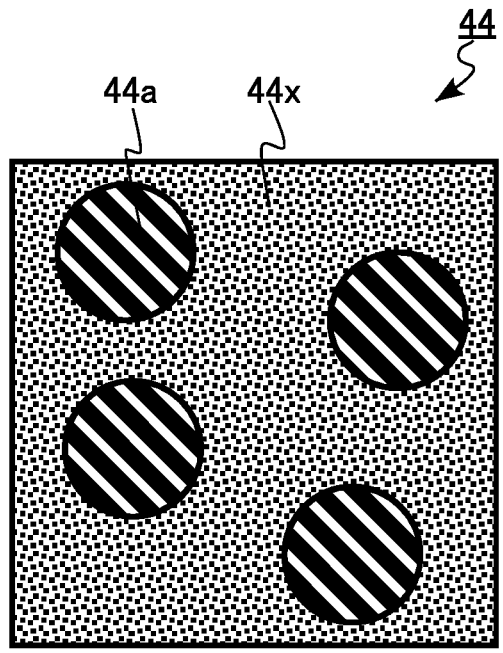

FIGS. 26A and 26B are explanatory diagrams of a first resin layer and second resin layer of the eleventh embodiment. FIG. 26A is an enlarged schematic cross-sectional view of a part of the first resin layer, that is, a coating resin layer 42. FIG. 26B is an enlarged schematic cross-sectional view of a part of the second resin layer, that is, an inter-wire resin layer 44.

As illustrated in FIGS. 26A and 26B, a particle diameter of a plurality of first particles 42a included in the coating resin layer 42 is smaller than a particle diameter of a plurality of second particles 44a included in the inter-wire resin layer 44. Therefore, a median particle diameter of the first particles 42a is smaller than a median particle diameter of the second particles 44a.

Because the median particle diameter of the first particles 42a is smaller than the median particle diameter of the second particles 44a, fracture toughness of the inter-wire resin layer 44 is lower than the fracture toughness of the inter-wire resin layer 44 of the ninth embodiment.

Because the fracture toughness of the inter-wire resin layer 44 is low, cracking is more likely to occur in the inter-wire resin layer 44, which is farther from a superconducting wire 40 than the coating resin layer 42 is. In other words, cracking is less likely to occur in the coating resin layer 42, which is closer to the superconducting wire 40.

Therefore, cracking is further less likely to occur in the coating resin layer 42, which is closer to the superconducting wire 40, as compared to a case of the superconducting coil 200 of the ninth embodiment. Therefore, occurrence of quenching is further suppressed.

As described above, according to the eleventh embodiment, a superconducting coil in which occurrence of quenching is further suppressed can be implemented.

Twelfth Embodiment

A superconducting coil of a twelfth embodiment is different from the superconducting coil of the ninth embodiment in that occupancy ratio of first particles in a first resin layer is higher than occupancy ratio of the second particles in a second resin layer. Hereinafter, a part of description of content overlapping content of the ninth embodiment will be omitted.

Figure 27A:
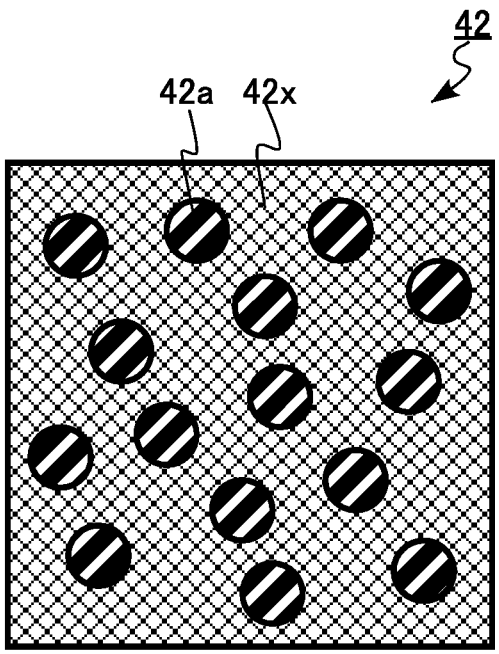
FIGS. 27A and 27B are explanatory diagrams of a first resin layer and a second resin layer of a twelfth embodiment.
Figure 27B:
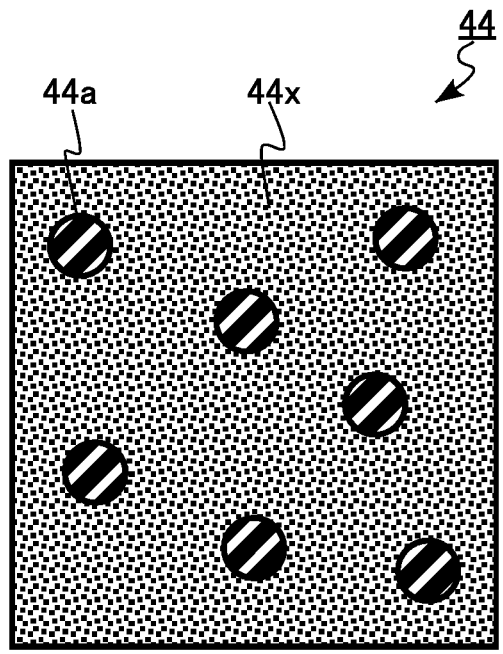

FIGS. 27A and 27B are explanatory diagrams of first resin layer and the second resin layer of the twelfth embodiment. FIG. 27A is an enlarged schematic cross-sectional view of a part of the first resin layer, that is, a coating resin layer 42. FIG. 27B is an enlarged schematic cross-sectional view of a part of the second resin layer, that is, an inter-wire resin layer 44.

As illustrated in FIGS. 27A and 27B, occupancy ratio of a plurality of first particles 42a included in the coating resin layer 42 is higher than occupancy ratio of a plurality of second particles 44a included in the inter-wire resin layer 44.

Because the occupancy ratio of the first particles 42a is higher than the occupancy ratio of the second particles 44a, fracture toughness of the inter-wire resin layer 44 is lower than the fracture toughness of the inter-wire resin layer 44 of the ninth embodiment.

Because the fracture toughness of the inter-wire resin layer 44 is low, cracking is more likely to occur in the inter-wire resin layer 44, which is farther from a superconducting wire 40 than the coating resin layer 42 is. In other words, cracking is less likely to occur in the coating resin layer 42, which is closer to the superconducting wire 40.

Therefore, cracking is further less likely to occur in the coating resin layer 42, which is closer to the superconducting wire 40, as compared to a case of the superconducting coil 200 of the ninth embodiment. Therefore, occurrence of quenching is further suppressed.

As described above, according to the twelfth embodiment, a superconducting coil in which occurrence of quenching is further suppressed can be implemented.

Thirteenth Embodiment

A superconducting coil of a thirteenth embodiment is different from the superconducting coil of the ninth embodiment in that second particles include crystal having cleavage. Hereinafter, a part of description of content overlapping content of the ninth embodiment will be omitted.

Figure 28A:
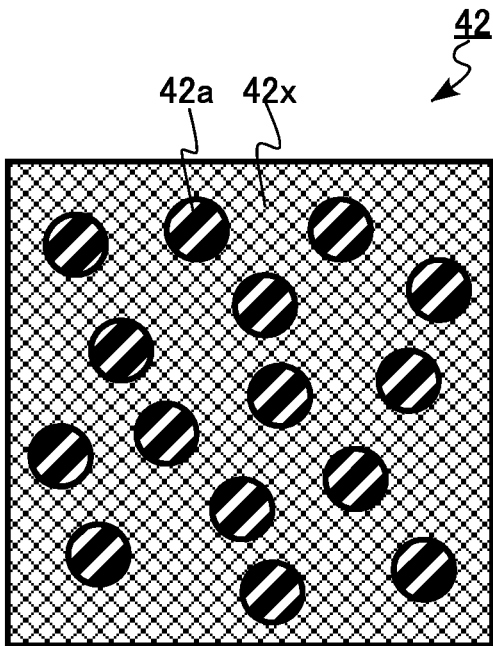
FIGS. 28A and 28B are explanatory diagrams of a first resin layer and a second resin layer of a thirteenth embodiment.
Figure 28B:
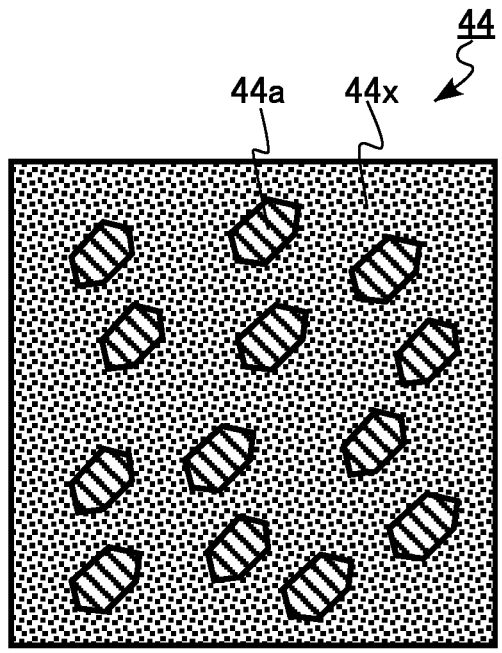

FIGS. 28A and 28B are explanatory diagrams of a first resin layer and second resin layer of the thirteenth embodiment. FIG. 28A is an enlarged schematic cross-sectional view of a part of the first resin layer, that is, a coating resin layer 42. FIG. 28B is an enlarged schematic cross-sectional view of a part of the second resin layer, that is, an inter-wire resin layer 44.

A plurality of second particles 44a included in the inter-wire resin layer 44 include crystal having cleavage.

The second particles 44a have volume resistivity of $10^{-2}$ $\Omega \cdot m$ or more and include crystal having cleavage. The crystal is a main component of the second particles 44a. The crystal occupies 90% or more of volume of the second particles 44a. The second particles 44a are, for example, the crystal itself.

Cleavage is a property of crystal tending to break parallel to a specific crystal plane. Cleavage is classified as perfect, good, distinct, or indistinct, depending on a degree. The second particles 44a have, for example, perfect or distinct cleavage.

Volume resistivity and cleavage are physical properties unique to crystal. If the crystal included in the second particles 44a is identified, volume resistivity and cleavage of the crystal can be determined. The crystal included in the second particles 44a can be identified by, for example, a powder X-ray diffraction method.

The crystal included in the second particles 44a is, for example, at least either of phyllosilicate mineral or hexagonal boron nitride. Volume resistivity of the phyllosilicate mineral or the hexagonal boron nitride is, for example, $10^{-2}$ $\Omega \cdot m$ or more and $10^{15}$ $\Omega \cdot m$ or less. Further, the phyllosilicate mineral or the hexagonal boron nitride has cleavage.

The phyllosilicate mineral has a sheet structure formed by a two-dimensionally spread $SiO_2$ tetrahedra. The phyllosilicate mineral is plate-shaped or flake-shaped and has perfect or distinct cleavage parallel to a bottom surface.

The phyllosilicate mineral included in the second particles 44a is, for example, at least one of mineral belonging to the mica group, clay mineral, pyrophyllite, or talc. The mineral belonging to the mica group is, for example, muscovite, phlogopite or biotite. The clay mineral is, for example, kaolinite or montmorillonite.

A shape of the second particles 44a is, for example, but not particularly limited to, a plate shape, a spherical shape, a bale shape, a spheroidal shape, a columnar shape, a fibrous shape, or an irregular shape. FIG. 28B exemplifies a case where the second particles 44a have a plate shape.

Crystal having cleavage breaks by relatively little stress. Therefore, because the second particles 44a include crystal having cleavage, fracture toughness of the inter-wire resin layer 44 is lower than the fracture toughness of the inter-wire resin layer 44 of the ninth embodiment.

Because the fracture toughness of the inter-wire resin layer 44 is low, cracking is more likely to occur in the inter-wire resin layer 44, which is farther from a superconducting wire 40 than the coating resin layer 42 is. In other words, cracking is less likely to occur in the coating resin layer 42, which is closer to the superconducting wire 40.

Therefore, cracking is further less likely to occur in the coating resin layer 42, which is closer to the superconducting wire 40, as compared to a case of the superconducting coil 200 of the ninth embodiment. Therefore, occurrence of quenching is further suppressed.

The second particles 44a have volume resistivity of $10^{-2}$ $\Omega \cdot m$ or more, and therefore insulation between portions of the superconducting wire 40 is secured.

As described above, according to the thirteenth embodiment, a superconducting coil in which occurrence of quenching is further suppressed can be implemented.

Fourteenth Embodiment

A superconducting coil of a fourteenth embodiment is different from the superconducting coil of the ninth embodiment in having an irregular shape. Hereinafter, a part of description of content overlapping content of the ninth embodiment will be omitted.

Figure 29A:
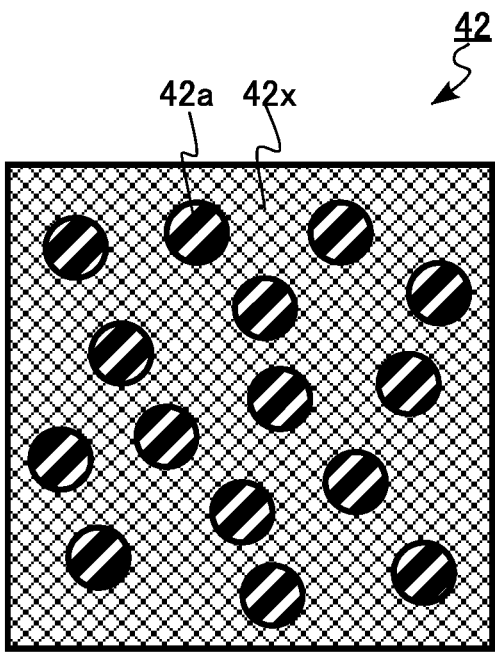
FIGS. 29A and 29B are explanatory diagrams of a first resin layer and a second resin layer of a fourteenth embodiment.
Figure 29B:
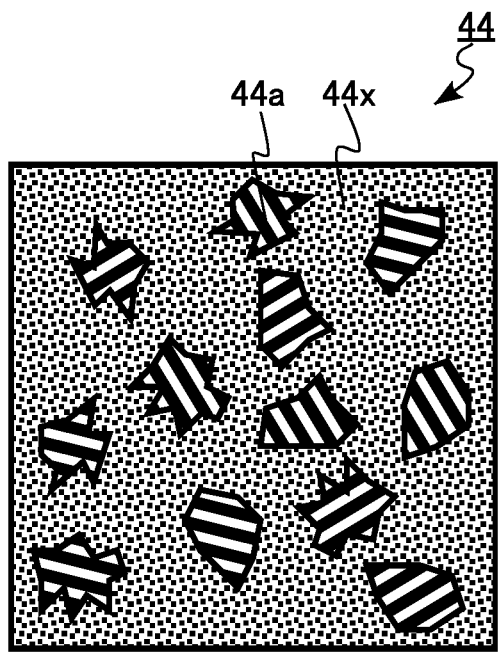

FIGS. 29A and 29B are explanatory diagrams of a first resin layer and second resin layer of the fourteenth embodiment. FIG. 29A is an enlarged schematic cross-sectional view of a part of the first resin layer, that is, a coating resin layer 42. FIG. 29B is an enlarged schematic cross-sectional view of a part of the second resin layer, that is, an inter-wire resin layer 44.

A plurality of second particles 44a included in the inter-wire resin layer 44 have an irregular shape. The second particles 44a are, for example, crushed silica.

A particle having an irregular shape breaks by relatively little stress, as compared to a spherical particle, for example. Therefore, because the second particles 44a have an irregular shape, fracture toughness of the inter-wire resin layer 44 is lower than the fracture toughness of the inter-wire resin layer 44 of the ninth embodiment.

Because the fracture toughness of the inter-wire resin layer 44 is low, cracking is more likely to occur in the inter-wire resin layer 44, which is farther from a superconducting wire 40 than the coating resin layer 42 is. In other words, cracking is less likely to occur in the coating resin layer 42, which is closer to the superconducting wire 40.

Therefore, cracking is further less likely to occur in the coating resin layer 42, which is closer to the superconducting wire 40, as compared to a case of the superconducting coil 200 of the ninth embodiment. Therefore, occurrence of quenching is further suppressed.

As described above, according to the fourteenth embodiment, a superconducting coil in which occurrence of quenching is further suppressed can be implemented.

Fifteenth Embodiment

A superconducting device of a fifteenth embodiment includes a superconducting coil of the first to fourteenth embodiments. Hereinafter, a part of description of content overlapping content of the first to fourteenth embodiments will be omitted.

Figure 30:
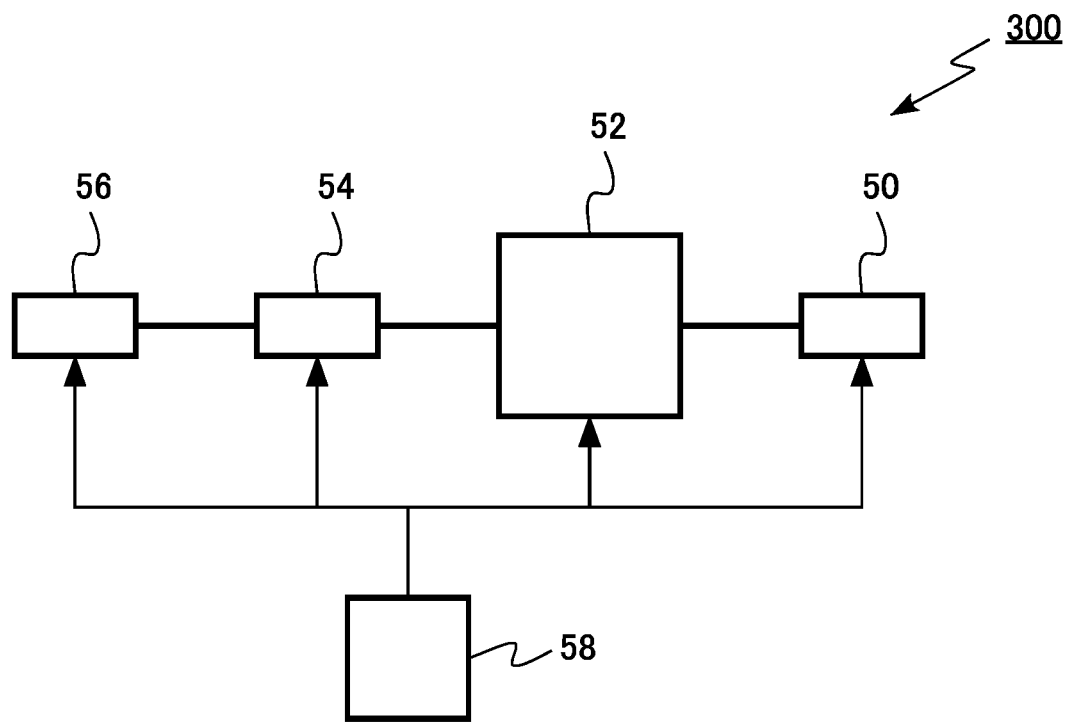
FIG. 30 is a block diagram illustrating a superconducting device of a fifteenth embodiment.

FIG. 30 is a block diagram illustrating the superconducting device of the fifteenth embodiment. The superconducting device of the fifteenth embodiment is heavy particle therapy equipment 300. The heavy particle therapy equipment 300 is an example of a superconducting device.

The heavy particle therapy equipment 300 includes an injection system 50, a synchrotron accelerator 52, a beam transportation system 54, an irradiation system 56, and a control system 58.

For example, the injection system 50 has a function of generating a carbon ion used for treatment and performing pre-acceleration to inject the carbon ion into the synchrotron accelerator 52. The injection system 50 has, for example, an ion generation source and a linear accelerator.

The synchrotron accelerator 52 has a function of accelerating a carbon ion beam injected from the injection system 50 to energy suitable for treatment. The synchrotron accelerator 52 uses a superconducting coil of the first to fourteenth embodiments.

The beam transportation system 54 has a function of transporting the carbon ion beam injected from the synchrotron accelerator 52 to the irradiation system 56. The beam transportation system 54 has, for example, a bending electromagnet.

The irradiation system 56 includes a function of irradiating the carbon ion beam injected from the beam transportation system 54 to a patient as an irradiation object. The irradiation system 56 has, for example, a rotary gantry that allows irradiation of a carbon ion beam from any direction. The rotary gantry uses a superconducting coil of the first to fourteenth embodiments.

The control system 58 controls the injection system 50, the synchrotron accelerator 52, the beam transportation system 54, and the irradiation system 56. The control system 58 is, for example, a computer.

In the heavy particle therapy equipment 300 of the fifteenth embodiment, the synchrotron accelerator 52 and the rotary gantry use a superconducting coil of the first to fourteenth embodiments. Therefore, occurrence of quenching is suppressed, and high reliability is achieved.

In the fifteenth embodiment, a case of the heavy particle therapy equipment 300 is described as an example of the superconducting device. The superconducting device, however, may be an NMR, an MRI, or a superconducting magnetic levitation railway vehicle.

Sixteenth Embodiment

A superconducting wire rod for superconducting coil of a sixteenth embodiment includes a superconducting wire and a resin layer that coats the superconducting wire and includes particles and resin surrounding the particles.

A superconducting wire rod 400 of the sixteenth embodiment is linear shape, for example. By being wound on a surface of an insulating substrate in a three-dimensional shape, for example, the superconducting wire rod 400 forms a saddle-type superconducting coil. By being wound on a winding frame, for example, the superconducting wire rod 400 forms a solenoid superconducting coil.

Figure 31:
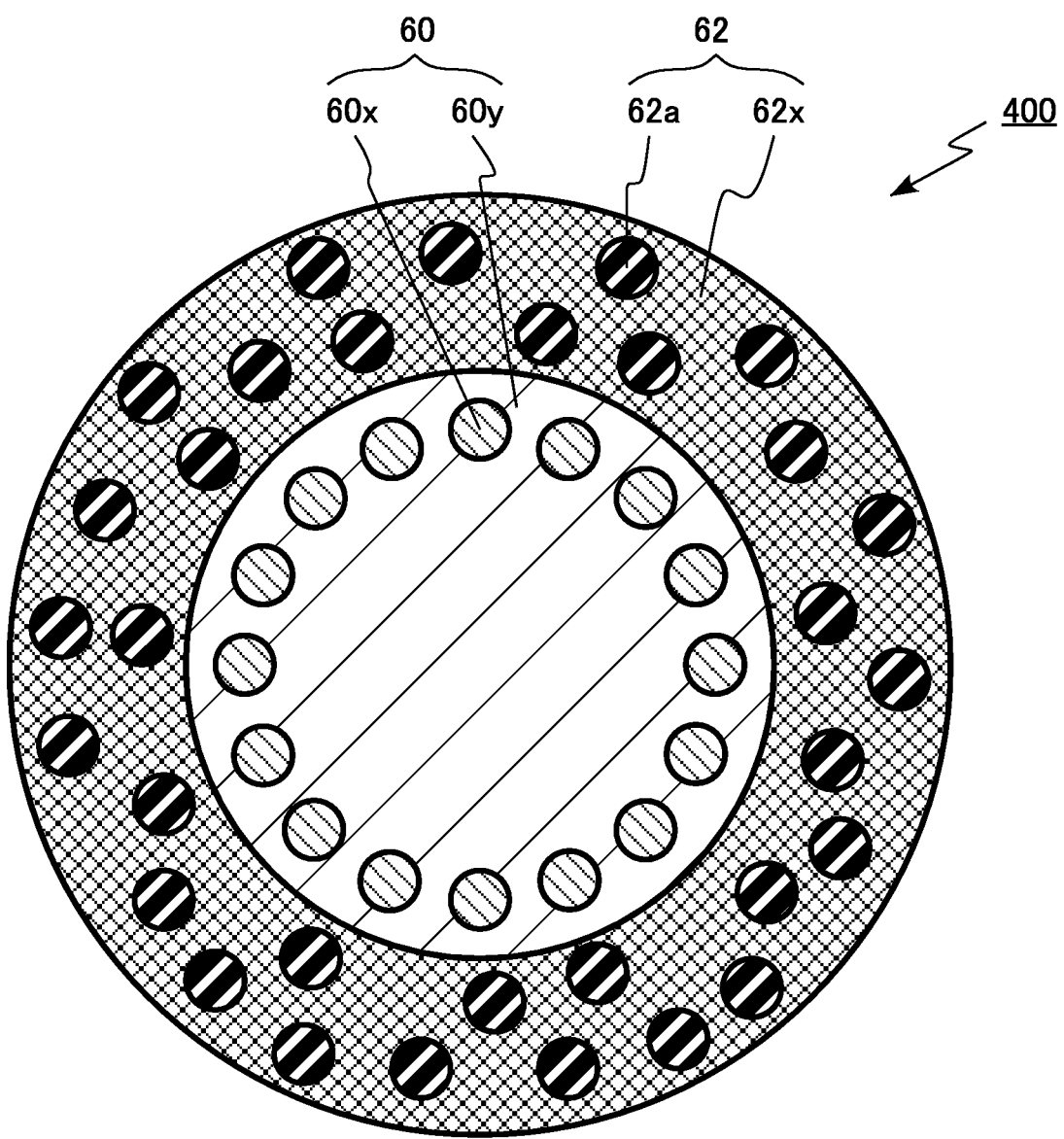
FIG. 31 is a schematic cross-sectional view illustrating a superconducting wire rod of a sixteenth embodiment.

FIG. 31 is a schematic cross-sectional view illustrating a superconducting wire rod of the sixteenth embodiment.

A cross section of the superconducting wire rod 400 is, for example, circular. A diameter of the superconducting wire rod 400 is, for example, 0.5 mm or more and 2 mm or less.

The superconducting wire rod 400 includes a superconducting wire 60 and a coating resin layer 62. The coating resin layer 62 is an example of a resin layer.

The superconducting wire 60 includes superconducting materials 60x and a metal matrix 60y. The superconducting wire 60 has a structure in which a plurality of superconducting materials 60x are disposed in the metal matrix 60y.

The superconducting material 60x is, for example, a low-temperature superconducting material having a critical temperature Tc of 8 K or higher and 40 K or lower. The superconducting material 60x is, for example, a niobium-titanium alloy-based, niobium-tin compound-based, niobium-aluminum compound-based, or magnesium diboride-based low-temperature superconducting material.

The metal matrix 60y is metal. The metal matrix 60y is, for example, copper.

The coating resin layer 62 coats the superconducting wire 60. The coating resin layer 62 is in contact with the superconducting wire 60.

The coating resin layer 62 has a function of coating and protecting the superconducting wire 60. Thickness of the coating resin layer 62 is, for example, 30 μm or more and 100 μm or less.

The coating resin layer 62 includes particles 62a and resin 62x. The resin 62x surrounds the particles 62a. The particles 62a are so-called filler.

The resin 62x is, for example, thermoplastic resin. The resin 62x is, for example, polyvinyl formal resin.

Material of the resin 62x can be identified by, for example, an FT-IR.

The particles 62a are inorganic. The particles 62a include, for example, at least one inorganic substance selected from a group including silica, alumina, silicon nitride, and alumina nitride. For example, the at least one inorganic substance occupies 90% or more of volume of the first particles 42a.

A chemical composition of the particles 62a can be determined by, for example, identifying crystal by an X-ray diffraction method. In a case where the particles 62a have poor crystallinity, the chemical composition of first particles 14a can be measured by observing a cross section of the coating resin layer 62 with an SEM, and performing an elemental analysis with an EDS.

A median particle diameter of the particles 62a is, for example, 1 μm or more and 10 μm or less. The median particle diameter of the particles 62a can be obtained from, for example, major axes of a plurality of particles 62a which are measured with an image acquired by the SEM (an SEM image).

A shape of the particles 62a is, for example, but not particularly limited to, a plate shape, a spherical shape, a bale shape, a spheroidal shape, a columnar shape, a fibrous shape, or an irregular shape. FIG. 31 exemplifies a case where the particles 62a have a spherical shape.

Occupancy ratio of the particles 62a in the coating resin layer 62 is, for example, 20% or more and 80% or less.

The occupancy ratio of the particles 62a in the coating resin layer 62 is represented by, for example, a proportion of the particles 62a occupying an area observed in the SEM image. The occupancy ratio of the particles 62a can be obtained by, for example, an image analysis of the SEM image.

In the superconducting wire rod 400 of the sixteenth embodiment, the coating resin layer 62 includes filler. Therefore, difference in coefficient of thermal expansion between the coating resin layer 62 and the metal matrix 60y included in the superconducting wire 60 is small, as compared to a case where the coating resin layer 62 does not include filler. Further, fracture toughness of the coating resin layer 62 is high, as compared to a case where the coating resin layer 62 does not include filler. Therefore, in a case where the superconducting wire rod 400 is applied to a superconducting coil, occurrence of cracking is suppressed in the coating resin layer 62, and occurrence of quenching is suppressed in the superconducting coil.

As described above, according to the sixteenth embodiment, a superconducting wire rod for superconducting coil in which occurrence of quenching is suppressed can be implemented.

While certain embodiments have been described, these embodiments have been presented by way of example only, and are not intended to limit the scope of the inventions. Indeed, a superconducting coil, a superconducting device, and a superconducting wire rod for superconducting coil described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A superconducting coil comprising:
a substrate having a curved surface;
a superconducting wire wound on the curved surface, the superconducting wire having a first region and a second region facing the first region;
a first resin layer surrounding the superconducting wire and including a plurality of first particles and first resin surrounding the first particles; and
a second resin layer positioned between the first region and the second region, the second resin layer covering the first resin layer and including a plurality of second particles and second resin surrounding the second particles and the second resin being made of material different from material of the first resin,
wherein particle diameter distribution of the first particles includes at least one peak, and a particle diameter of the at least on peak is 1 μm or more and 50 μm or less.

2. The superconducting coil according to claim 1,
wherein the first resin is thermoplastic resin, and the second resin is thermo-setting resin.

3. The superconducting coil according to claim 1, further comprising a fourth resin layer disposed between the superconducting wire and the first resin layer, the fourth resin layer surrounding the superconducting wire, and the fourth resin layer including a plurality of fourth particles and fourth resin surrounding the fourth particles and the fourth resin being made of material different from the material of the first resin.

4. The superconducting coil according to claim 1,
wherein the particle diameter distribution of the first particles is bimodal.

5. The superconducting coil according to claim 4,
wherein, in the particle diameter distribution, a particle diameter of a first peak is 1 μm or more and 10 μm or less, and a particle diameter of a second peak is 10 μm or more and 50 μm or less.

6. The superconducting coil according to claim 1,
wherein a median particle diameter of the first particles is smaller than a median particle diameter of the second particles.

7. The superconducting coil according to claim 1,
wherein occupancy ratio of the first particles in the first resin layer is higher than occupancy ratio of the second particles in the second resin layer.

8. The superconducting coil according to claim 1,
wherein the second particles include crystal having cleavage.

9. The superconducting coil according to claim 1,
wherein the second particles have an irregular shape.

10. A superconducting device comprising the superconducting coil according to claim 1.

11. The superconducting coil according to claim 1,
wherein the first resin is phenoxy resin.

12. The superconducting coil according to claim 1,
wherein the first particles include at least one inorganic substance selected from a group consisting of silica, alumina, silicon nitride, and alumina nitride.

13. A superconducting coil comprising:
a substrate having a curved surface;
a superconducting wire wound on the curved surface, the superconducting wire having a first region and a second region facing the first region;
a first resin layer surrounding the superconducting wire and including a plurality of first particles and first resin surrounding the first particles;
a second resin layer positioned between the first region and the second region, the second resin layer covering the first resin layer and including a plurality of second particles and second resin surrounding the second particles and the second resin being made of material different from material of the first resin; and
a third resin layer disposed between the substrate and the first resin layer, and between the substrate and the second resin layer, the third resin layer being in contact with the first resin layer and the second resin layer, and the third resin layer including a plurality of third particles and third resin surrounding the third particles and the third resin being made of material different from the material of the second resin.

14. The superconducting coil according to claim 13, wherein material of the first particles and material of the third particles is identical, and the material of the first resin and the material of the third resin is identical.

\* \* \* \* \*